United States Patent
Burkhardt et al.

(10) Patent No.: US 10,838,366 B2
(45) Date of Patent: Nov. 17, 2020

(54) BIDIRECTIONAL MEMS DRIVING ARRANGEMENTS WITH A FORCE ABSORBING SYSTEM

(71) Applicant: Timex Group USA, Inc., Middlebury, CT (US)

(72) Inventors: Wolfgang Burkhardt, Ispringen (DE); Michail Subarew, Graben-Neudorf (DE); Heiko Hellriegel, Bruchsal (DE); Helmut Zachmann, Remchingen (DE)

(73) Assignee: Timex Group USA, Inc., Middlebury, CT (US)

( * ) Notice: Subject to any disclaimer, the term of this patent is extended or adjusted under 35 U.S.C. 154(b) by 0 days.

(21) Appl. No.: 15/704,405

(22) Filed: Sep. 14, 2017

(65) Prior Publication Data

US 2019/0079458 A1    Mar. 14, 2019

(51) Int. Cl.
*G04B 37/04* (2006.01)
*G04B 43/00* (2006.01)
(Continued)

(52) U.S. Cl.
CPC .............. *G04B 43/002* (2013.01); *B81B 5/00* (2013.01); *B81B 7/0016* (2013.01); *G04B 13/00* (2013.01); *G04B 37/04* (2013.01); *G04G 17/00* (2013.01); *B81B 2201/033* (2013.01); *B81B 2201/035* (2013.01); *B81B 2203/056* (2013.01)

(58) Field of Classification Search
CPC ...... G04B 13/00; G04B 37/04; G04B 43/002; B81B 2203/056; B81B 7/0016; B81B 5/00; B81B 2201/033; B81B 2201/035; G04G 17/00
See application file for complete search history.

(56) References Cited

U.S. PATENT DOCUMENTS 5,535,902 A * 7/1996 Greiff ................ B81B 3/0051
216/2
5,555,765 A * 9/1996 Greiff ................ B81B 3/0051
73/504.09
(Continued)

FOREIGN PATENT DOCUMENTS

DE    10201183487 A1    9/2011
WO    2006046194 A1    5/2006

OTHER PUBLICATIONS

"A Resonating Comb/Ring Angular Rate Sensor Vacuum Packaged Via Wafer Bonding" SAE Technical Papers, Mar. 1999. 8 pages. (Admitted prior art).
(Continued)

*Primary Examiner* — Sean Kayes
(74) *Attorney, Agent, or Firm* — Carmody Torrance Sandak & Hennessey LLP

(57) ABSTRACT

A micro-electromechanical systems (MEMS) driving arrangement for an electronic device, the micro-electromechanical systems (MEMS) driving arrangement including a driven wheel; a driving actuation assembly for causing rotation of the driven wheel; an indicator assembly including an indicator; and a force absorbing assembly coupled intermediate the indicator assembly and the driven wheel; whereby a force acting upon the indicator assembly is absorbed by the force absorbing assembly so as to inhibit rotation of the driven wheel relative to the driving actuation assembly.

15 Claims, 24 Drawing Sheets

(51) Int. Cl.
  *B81B 5/00* (2006.01)
  *G04B 13/00* (2006.01)
  *B81B 7/00* (2006.01)
  *G04G 17/00* (2013.01)

(56) References Cited

U.S. PATENT DOCUMENTS

| | | | |
|---|---|---|---|
| 5,650,568 A * | 7/1997 | Greiff | B81B 3/0051 |
| | | | 73/504.09 |
| 6,453,772 B1 * | 9/2002 | Moskob | F16H 1/32 |
| | | | 475/162 |
| 7,113,450 B2 | 9/2006 | Plancon et al. | |
| 7,438,465 B2 * | 10/2008 | Bitterli | G04B 19/042 |
| | | | 368/322 |
| 7,505,373 B2 | 3/2009 | Lionel et al. | |
| 7,592,737 B2 | 9/2009 | Bourbon et al. | |
| 7,922,385 B2 * | 4/2011 | Nagao | G04C 3/12 |
| | | | 310/311 |
| 7,969,262 B2 | 6/2011 | Steeneken et al. | |
| 8,189,431 B2 * | 5/2012 | Kitahara | G04C 3/12 |
| | | | 368/220 |
| 8,274,864 B2 * | 9/2012 | Ono | G04B 11/003 |
| | | | 368/220 |
| 8,764,282 B2 * | 7/2014 | Von Gunten | F16F 1/10 |
| | | | 368/169 |
| 8,926,465 B2 | 1/2015 | Stotz | |
| 2006/0187768 A1 * | 8/2006 | Murazumi | G04B 13/023 |
| | | | 368/324 |
| 2008/0113154 A1 * | 5/2008 | Bitterli | G04B 19/042 |
| | | | 428/131 |
| 2008/0212415 A1 * | 9/2008 | Nagao | G04C 3/12 |
| | | | 368/204 |
| 2010/0001615 A1 | 1/2010 | Steeneken et al. | |
| 2011/0252887 A1 | 10/2011 | Cardarelli | |
| 2013/0278108 A1 | 10/2013 | Liu et al. | |
| 2017/0185040 A1 * | 6/2017 | Mertenat | G04B 13/023 |
| 2017/0351218 A1 * | 12/2017 | Paratte | G04B 17/063 |

OTHER PUBLICATIONS http://archives.sensorsmag.com/articiles/1298/sil1298/.

* cited by examiner

BIDIRECTIONAL MEMS DRIVING ARRANGEMENTS WITH A FORCE ABSORBING SYSTEM

BACKGROUND OF THE INVENTION

The present invention is directed generally to motor arrangements that drive display hands, rings and other indicators for small (e.g., wearable) electronic devices, and in particular, to a micro-electromechanical system (MEMS) driving arrangement for an electronic device, and in a preferred embodiment, for driving hands, rings and/or other indicators in a timepiece, such as a wristworn device. In particular, the present invention is directed to embodiments that absorb forces and thus mitigate impacts for and/or to the MEMS driving arrangement.

Micro-electromechanical systems that are used as unidirectional and bidirectional drive units are known in the art. Currently, it is believed that the state of the art for bidirectional MEMS driving arrangements for timepieces is defined by that described in U.S. Pat. No. 8,926,465, which generally describes a MEMS driving arrangement for an electronic device that comprises a driven wheel, an actuator ring and a driving actuation assembly for driving the actuator ring in a hysteresis motion so as to cause rotation of the driven wheel, wherein the driven wheel rotates in response to engagements and disengagements between selective subsets of the teeth of the driven wheel with selective subsets of the teeth of the actuator ring. Other known wheel driving actuator designs are described in U.S. Pat. Nos. 7,592,737 and 7,505,373.

However, it is now believed that further advances to the state of the art are both desirable and achievable. For example, the inventors have discovered that MEMS driving arrangements for electronic devices, particularly those for wristworn devices as described for example in U.S. Pat. No. 8,926,465, are susceptible to unwanted and undesirable effects of forces created by jostles, bumps, knocks and impacts. Specifically, MEMS driving arrangements often include small and/or fragile parts, structures, functions and features and are thus susceptible to the forces and impacts associated with a wristworn device. Thus, the inventors have discovered that impact mitigation is a desirable objective in the aforementioned MEMS arrangements in order to mitigate, reduce and/or eliminate the unwanted or undesirable effects thereof.

Accordingly, it is desirable to provide a driving arrangement including a force absorbing and impact mitigation arrangement that can meet and/or exceed all of the needed objectives and advantages envisioned by the present inventors, including for use in the MEMS driving arrangements as disclosed herein.

SUMMARY AND OBJECTIVES OF THE INVENTION

It is thus an objective of the present invention to overcome the perceived deficiencies in the prior art.

Specifically, it is an objective of the present invention to provide an improved driving arrangement for an electronic device that utilizes the advantages afforded by the use of MEMS technology.

Another objective of the present invention is to provide an improved driving arrangement for an electronic device that utilizes the advantages afforded by the use of MEMS technology and includes a force absorbing and impact mitigation system.

For example, and with regard to the incorporation of an impact mitigation arrangement, an objective of the present invention is to maintain the integrity of the electronic device and achieve other functional benefits of MEMS technology as would be achieved with traditional gears with metal or plastic wheels, yet using lighter, smaller and more miniaturized components that are found in and/or associated with MEMS structures.

Still a further objective of the present invention is to provide an improved driving arrangement for an electronic device that utilizes the advantages afforded by the use of MEMS technology and which overcomes, is made resistant to and/or at least minimizes the effect of common forces that can be applied to timepieces and their components and that otherwise might cause a misalignment or other unwanted or undesirable displacement of the display indicator(s).

By example only and not limitation, another objective of the present invention is to provide for a certain temporary rotation angle of a display indicator, such as a display hand (e.g. an hour or minute hand), which may be caused by a sudden rotation stop or impact applied to the system, without losing the integrity (e.g. without losing hand position, etc.) of the driving arrangement or indicator assembly.

For example, an objective of the present invention is to ensure or at least minimize against the likelihood that a force against and/or temporary angular rotation elongation/movement of the indictor assembly and/or the indicator hand or wheel does not cause or result in an unintended or undesirable disengagement of the MEMS actuator(s) (i.e. the driving actuation assembly) with the MEMS rotating parts (e.g. the driven wheel).

Yet a further objective of the present invention is to provide an improved driving arrangement for an electronic device that utilizes the advantages afforded by the use of MEMS technology in a timepiece, and in particular, in a wristwatch.

Yet a further objective of the present invention is to provide an improved MEMS driving arrangement for a timepiece, and an analog wristwatch in particular.

Still another objective of the present invention is to provide an improved MEMS driving arrangement for an electronic device that prevents or at least minimizes the likelihood of an undesired rotation of the MEMS wheel, which ensures proper function of the timepiece without the need to calibrate or recalibrate the indicator hand(s).

Still another objective of the present invention is to provide an improved MEMS driving arrangement that preferably does not disengage from the driven wheel and thus prevents slippage or loss of calibration or accuracy of the display indicators controlled by the driving actuation assembly.

Still another objective of the present invention is to provide an improved MEMS driving arrangement that permits for the construction and use of a smaller and stronger MEMS driving assembly than heretofore seen in the art.

Still a further objective of the present invention is to provide methodologies for carrying out and/or facilitating the foregoing.

Further objects and advantages of this invention will become more apparent from a consideration of the drawings and ensuing description.

The invention accordingly comprises the features of construction, combination of elements, arrangement of parts and sequence of steps which will be exemplified in the construction, illustration and description hereinafter set forth, and the scope of the invention will be indicated in the claims.

Therefore, and generally speaking, in accordance with a first preferred embodiment, the invention is directed to a MEMS driving arrangement for an electronic device, the MEMS driving arrangement comprising a driven wheel; a driving actuation assembly for causing rotation of the driven wheel; an indicator assembly comprising an indicator; and a force absorbing assembly coupled intermediate the indicator assembly and the driven wheel; whereby a force acting upon the indicator assembly is absorbed by the force absorbing assembly so as to inhibit a rotation of the driven wheel relative to the driving actuation assembly. In a preferred embodiment, the wristworn device is a timepiece in the form of a wristwatch.

BRIEF DESCRIPTION OF THE DRAWINGS

The above set forth and other features of the invention are made more apparent in the ensuing Description of the Preferred Embodiments when read in conjunction with the attached Drawings, wherein.

Identical reference numerals in the figures are intended to indicate like parts, although not every feature in every figure may be called out with a reference numeral.

DETAILED DESCRIPTION OF THE PREFERRED EMBODIMENTS

Figure 1A:
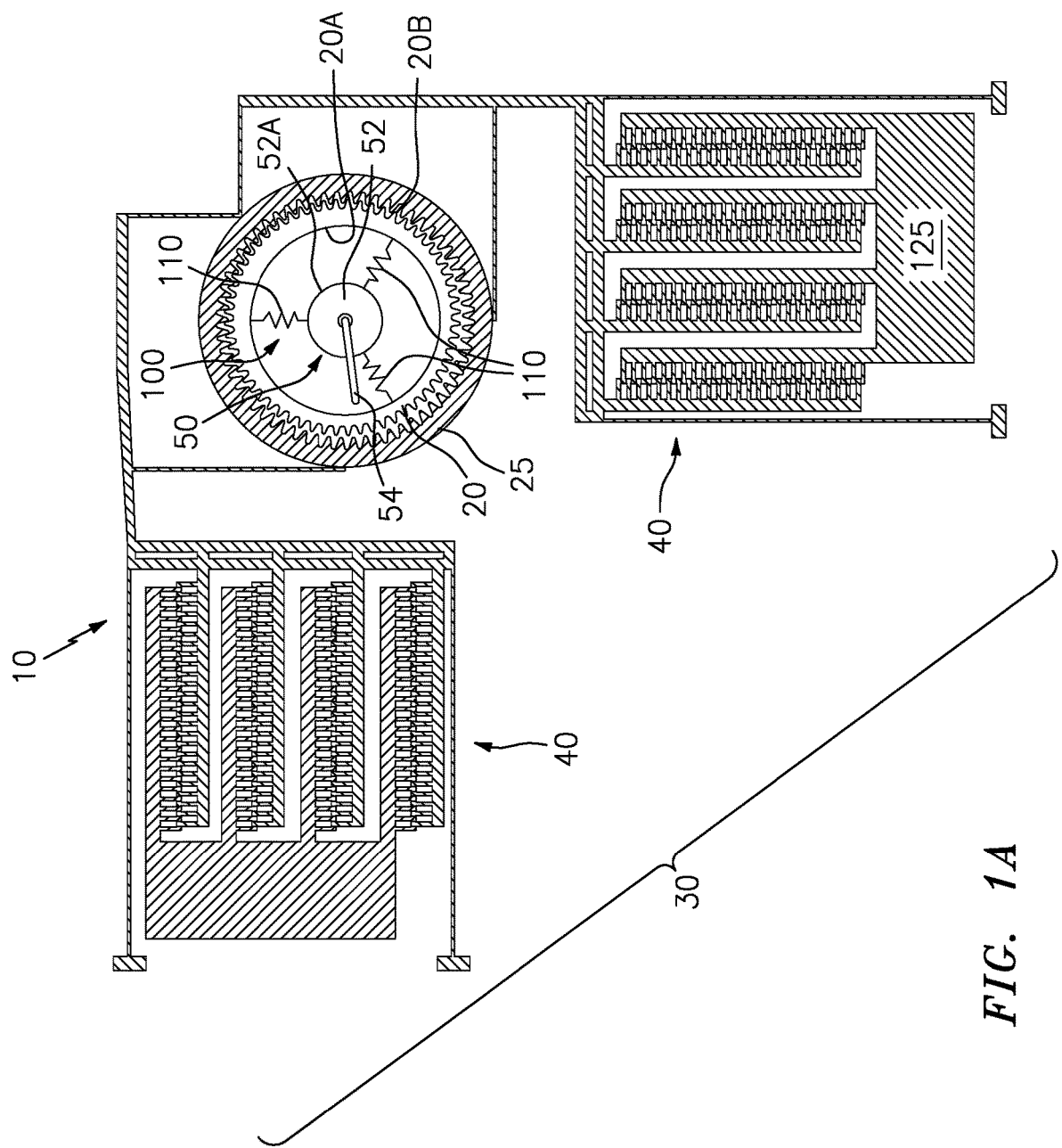
FIGS. 1A, 1B and 1C each illustrate a bidirectional MEMS driving arrangement constructed in accordance with preferred embodiments of the present invention.
Figure 1B:
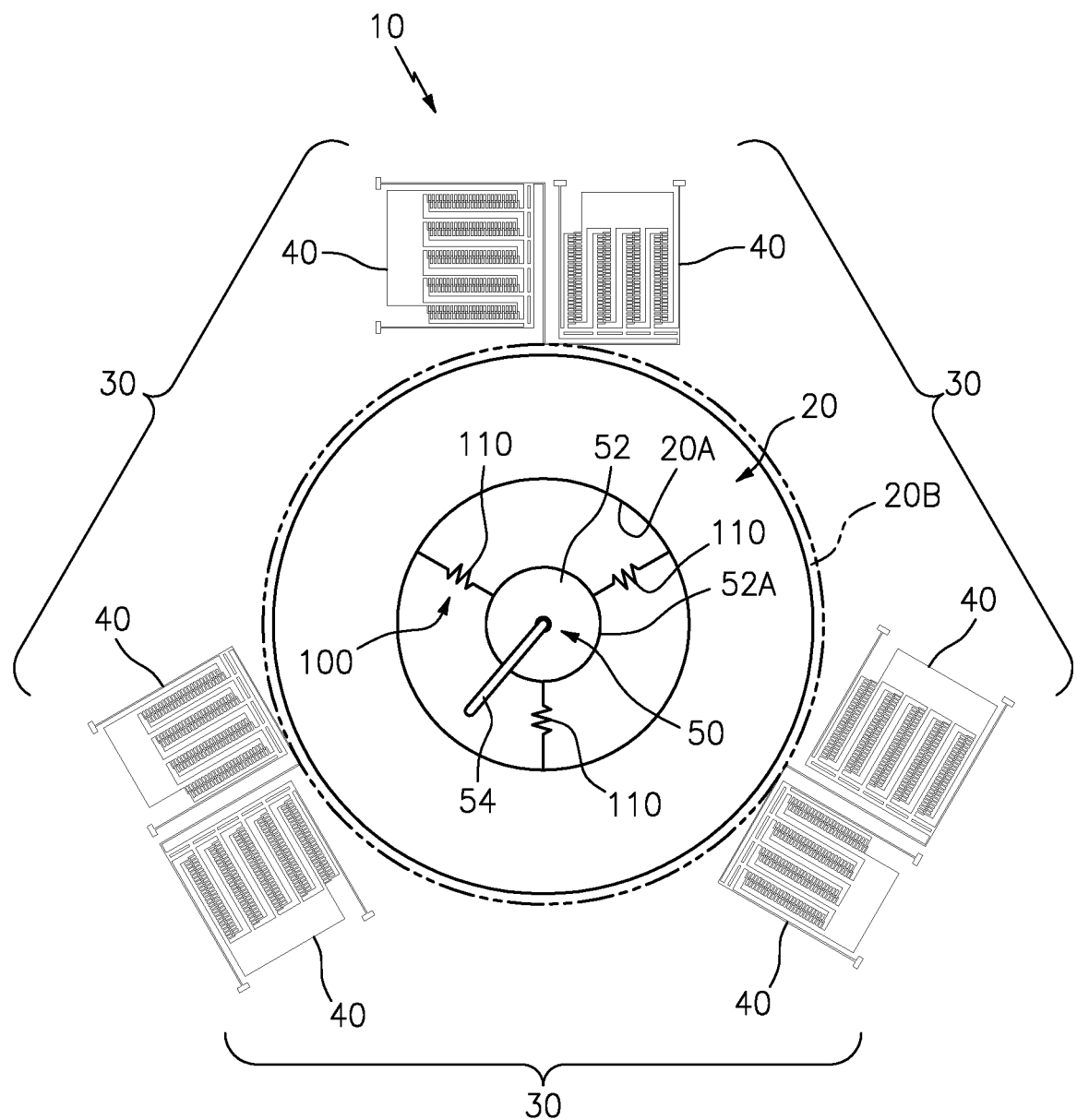
Figure 1C:
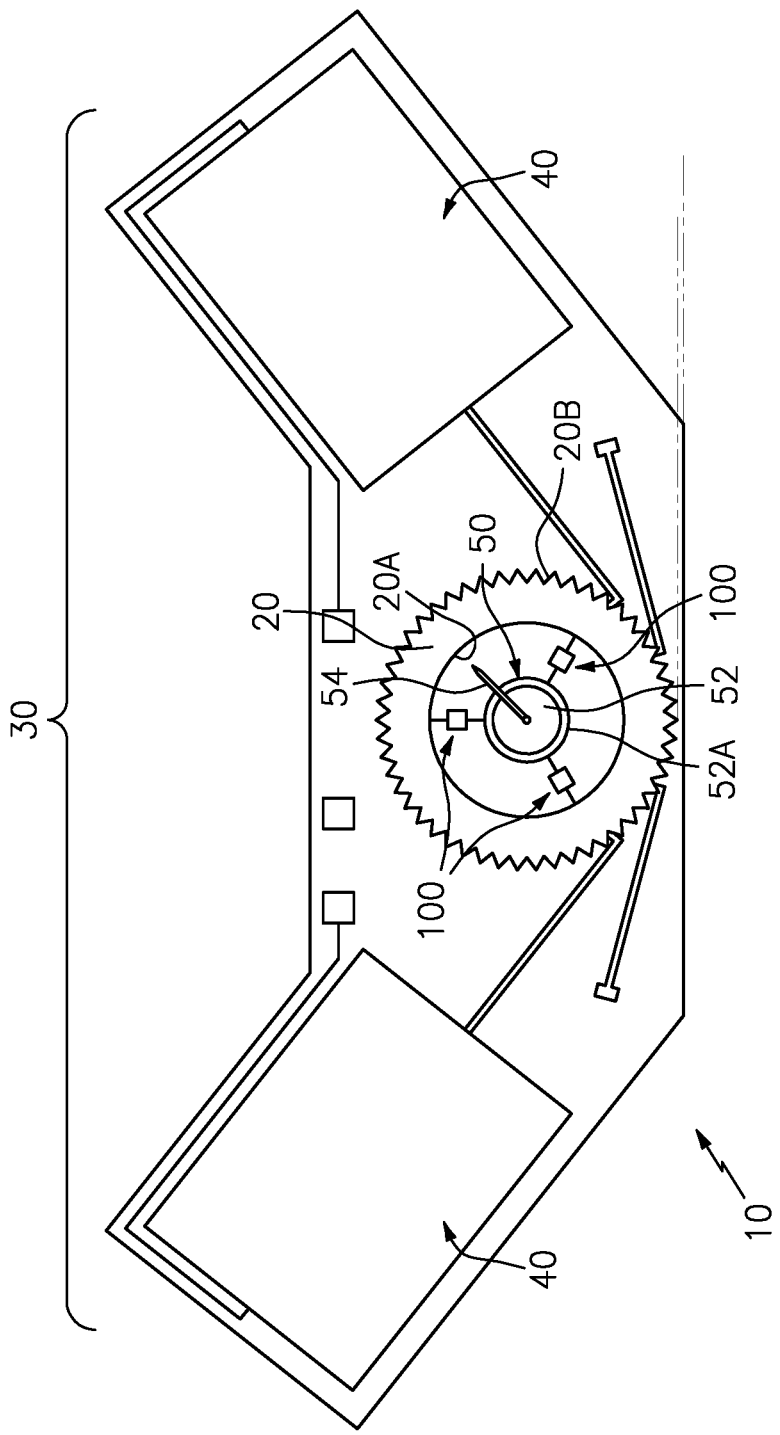

Reference is generally first made to FIGS. 1A, 1B and 1C, each of which illustrate various bidirectional MEMS driving arrangements for which the present invention is particularly applicable and in which the features of the present invention are incorporated. Because the present invention is equally applicable to each/all of the disclosed MEMS driving arrangements, references will generally be made to "MEMS driving arrangement 10" and it should be understood that such reference indicates applicability of the present invention to each of the embodiments disclosed herein as well as the remaining embodiments disclosed in the aforementioned U.S. Pat. Nos. 8,926,465, 7,592,737 and 7,505,373, the subject matter and disclosures of which are each and all incorporated by reference as if fully set forth herein.

As would be understood by those skilled in the art, each of the disclosed MEMS driving arrangements 10 comprise a driven wheel, generally indicated at 20, and a driving actuation assembly, generally indicated at 30, for causing rotation of the driven wheel 20. The driving of the driven wheel 20 may be achieved directly by the driving actuation assembly 30 of FIG. 1B, 1C, or in the case of the embodiment of FIG. 1A, via an actuation ring 25 as disclosed in the aforementioned U.S. Pat. No. 8,926,465. For example, in the embodiment of FIG. 1A, the driving actuation assembly 30 drives actuator ring 25 in a hysteresis-type motion so as to cause rotation of the driven wheel 20, again, details of which can be found in the aforementioned '465 patent.

In each of the preferred embodiments, the driving actuation assembly 30 comprises one or more driving actuators, each generally indicated at 40, with the driving actuation assembly 30 being coupled directly to the driven wheel 20 (FIG. 1B, 1C) or coupled to the driven wheel 20 via the actuator ring 25 (FIG. 1A). Again, details of the mechanisms and arrangements for rotating the driven wheel 20 may be found in the respective aforementioned patents.

Common to each/all of the MEMS driving arrangements 10 is an indicator assembly, generally indicated at 50, which in each of the exemplary embodiments comprises an indicator wheel or disc 52 and coupled thereto being an indicator 54 (see FIGS. 2-36). Indicator 54 is preferably an indicator hand that can provide information by its position and directional pointing on the face of a wristworn device, e.g. hours, minutes, seconds, compass settings, moon position, just to name a few, with many other alternative uses of such an indicator being disclosed in U.S. Pat. No. 7,113,450, the subject matter of which is incorporated by reference as if fully set forth herein. In the drawings, nothing of significance is intended by the particular shading of wheel 52, as such shading is simply to ensure an understanding of where one wheel begins and another ends. Wheel/disc 52 in each of the embodiments is preferably made out of conventional material known in the art for such MEMS driving wheels.

However, it should also be understood that indicator 54 could also be a ring and/or other types of indicators that are subject to rotational forces and misalignment thereby, with such other types of indicators also disclosed in the aforementioned U.S. Pat. No. 7,113,450.

Furthermore, and common to each/all of the MEMS driving arrangements 10 is a force absorbing assembly, generally indicated at 100, coupled intermediate the indicator assembly 50 and the driven wheel 20. With the inclusion of a force absorbing assembly 100 in the driving arrangements, a force acting upon the indicator assembly 50 is absorbed by the force absorbing assembly 100 so as to inhibit a rotation of the driven wheel 20 relative to the driving actuation assembly 30 due to the force acting upon the indicator assembly 50.

Disclosed herein are a plurality of force absorbing assemblies 100 suitable for use in connection with each/all of the MEMS driving arrangements 10.

As shown in FIGS. 2-36, each of the force absorbing assemblies 100 may take on a plurality of shapes and configurations, each of which are constructed to meet the specific torque, force, resiliency, absorption and other criteria that would be considered by one skilled in the art.

Figure 7:
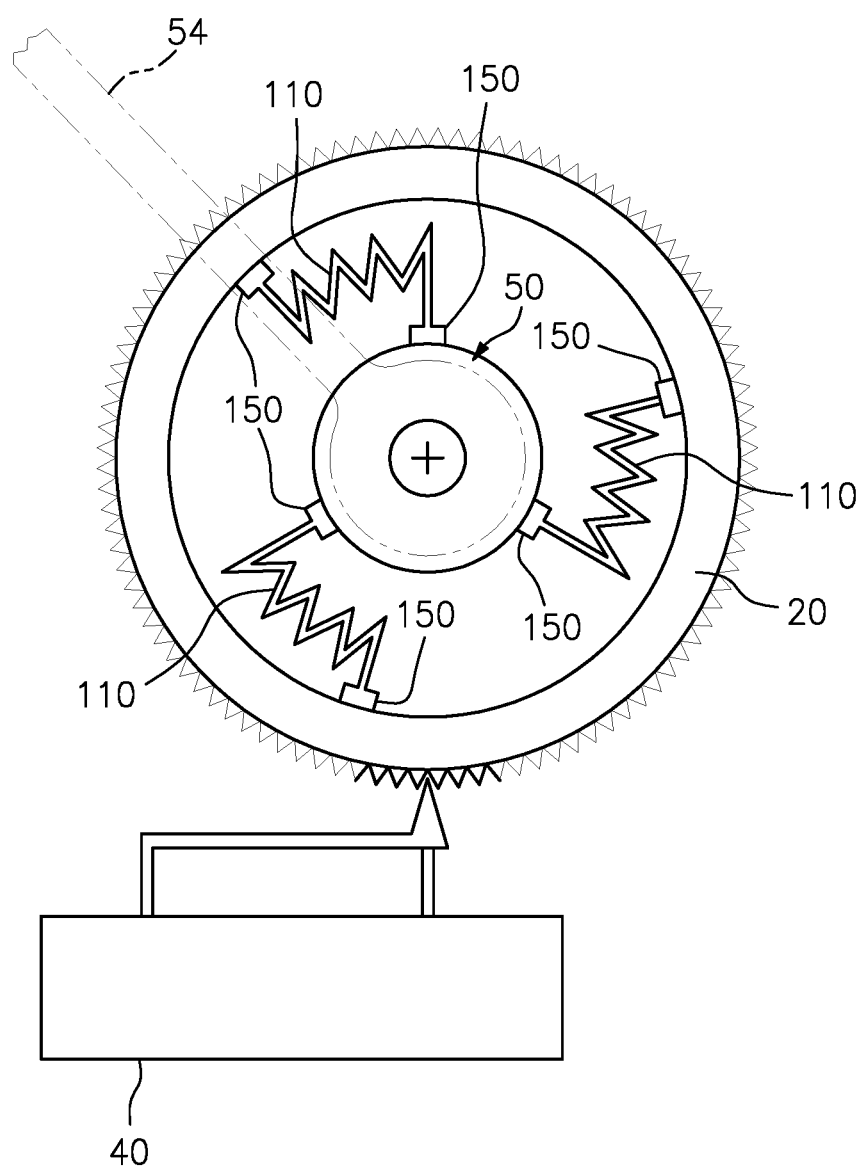
Figure 8:
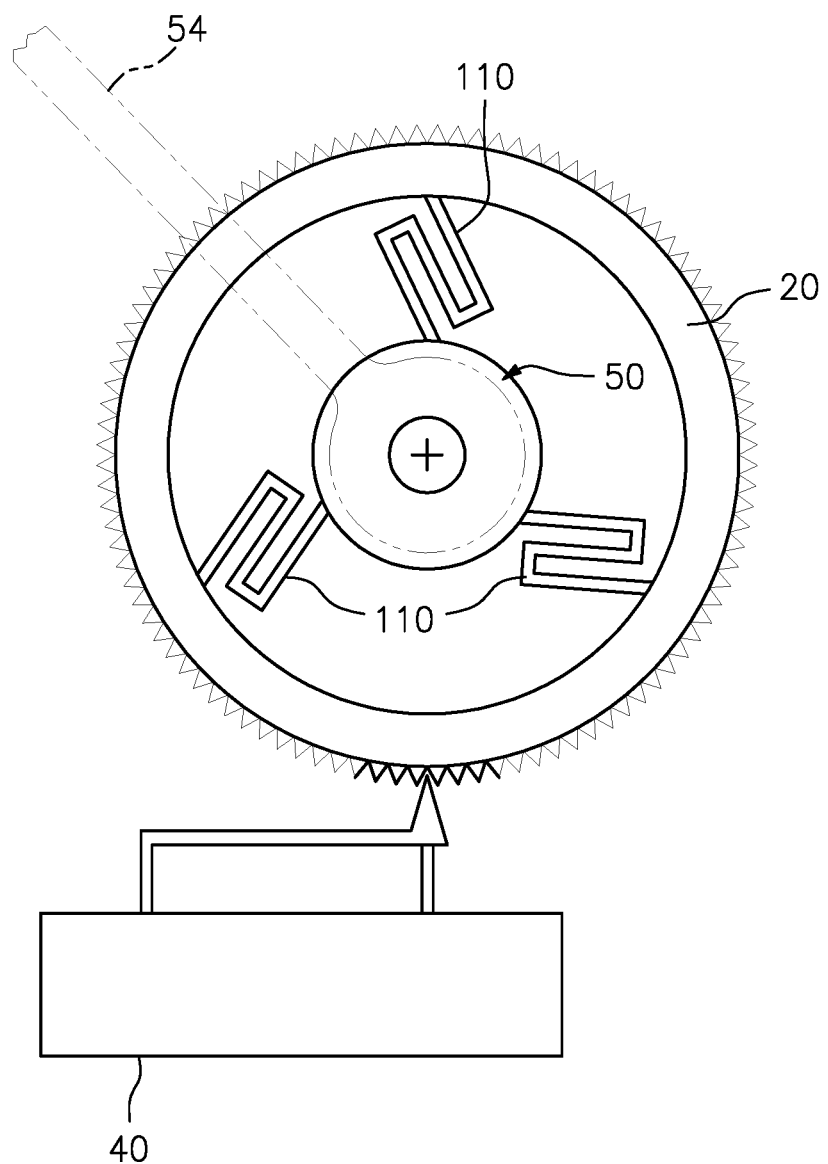
Figure 9:
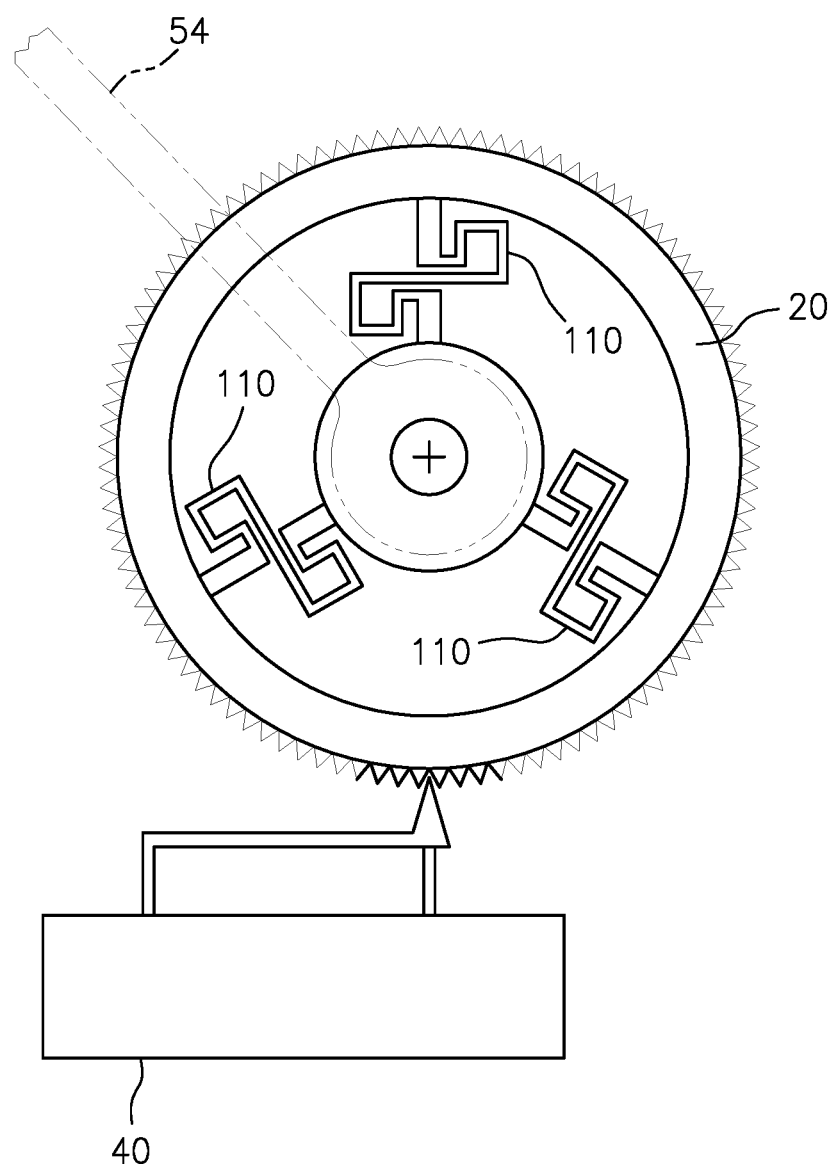
Figure 10:
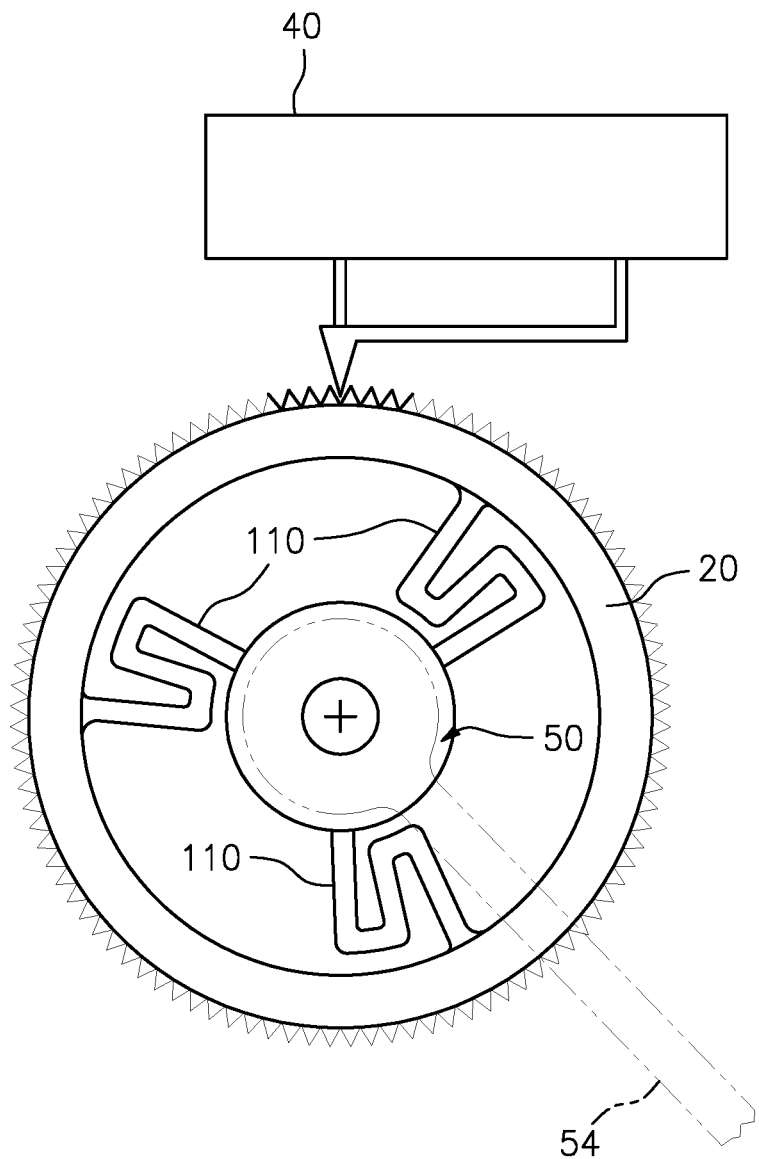
Figure 11:
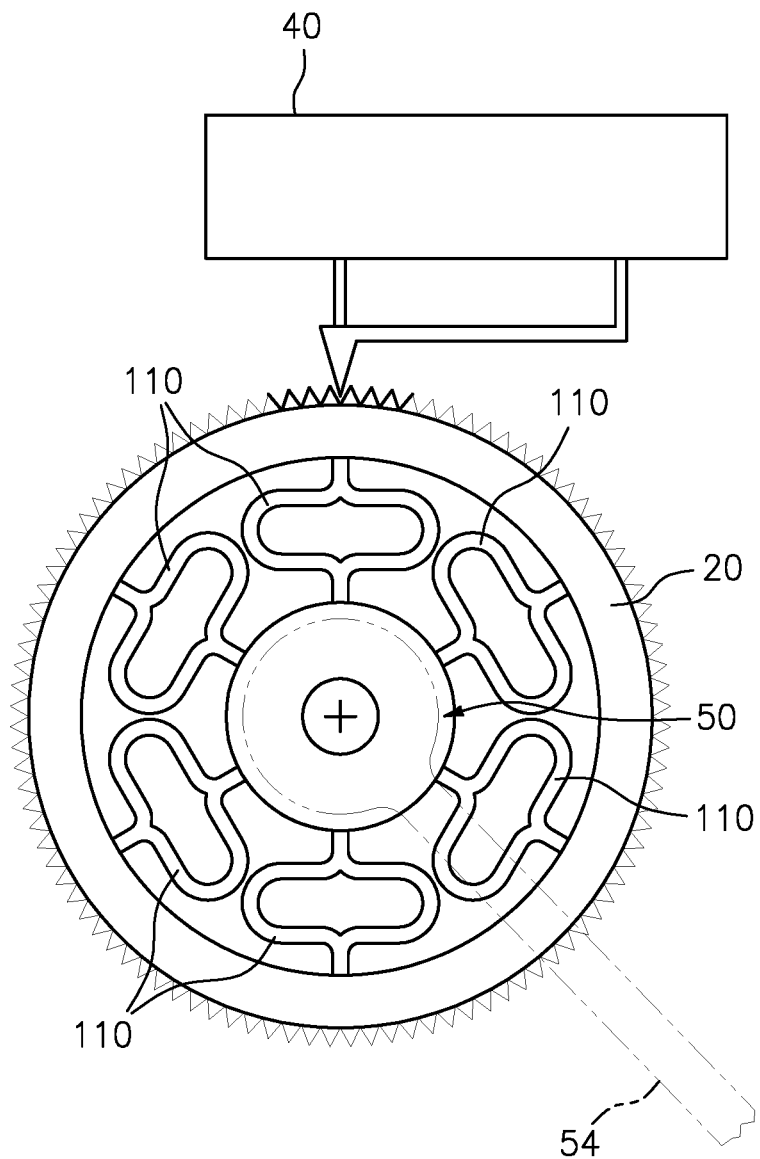
Figure 12:
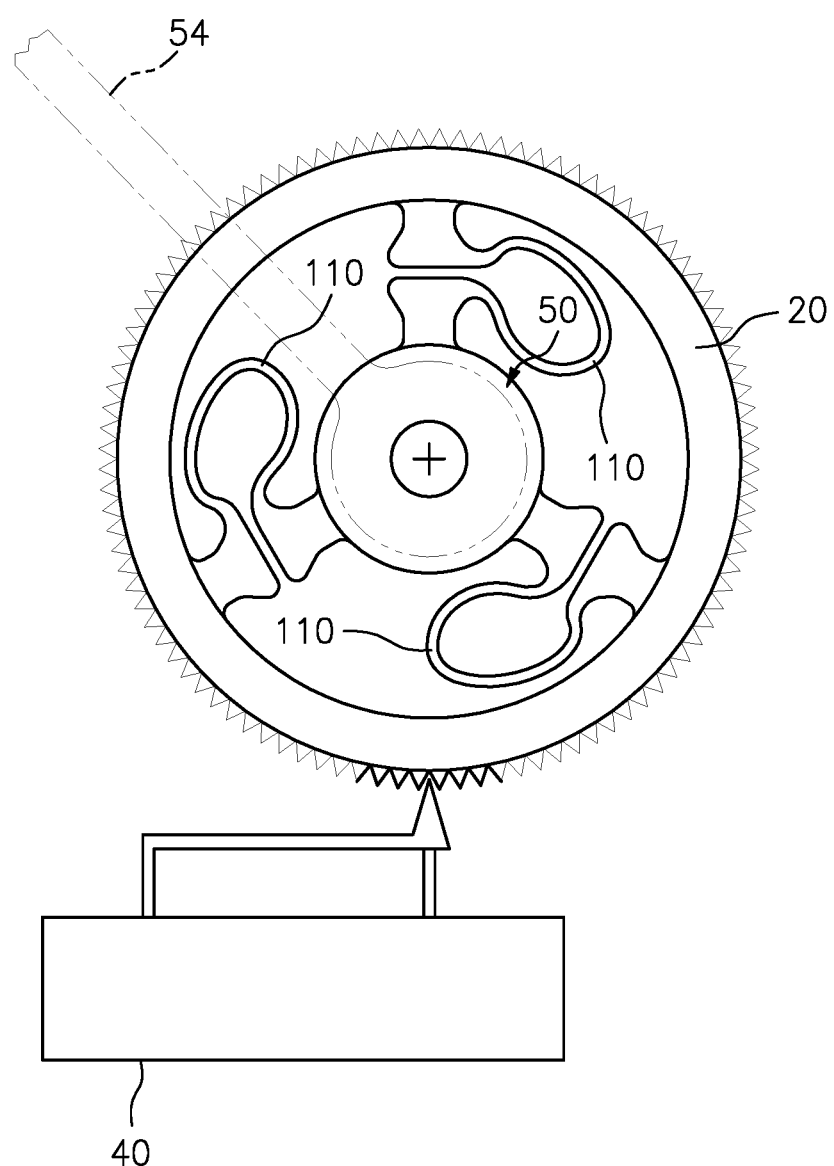
Figure 13:
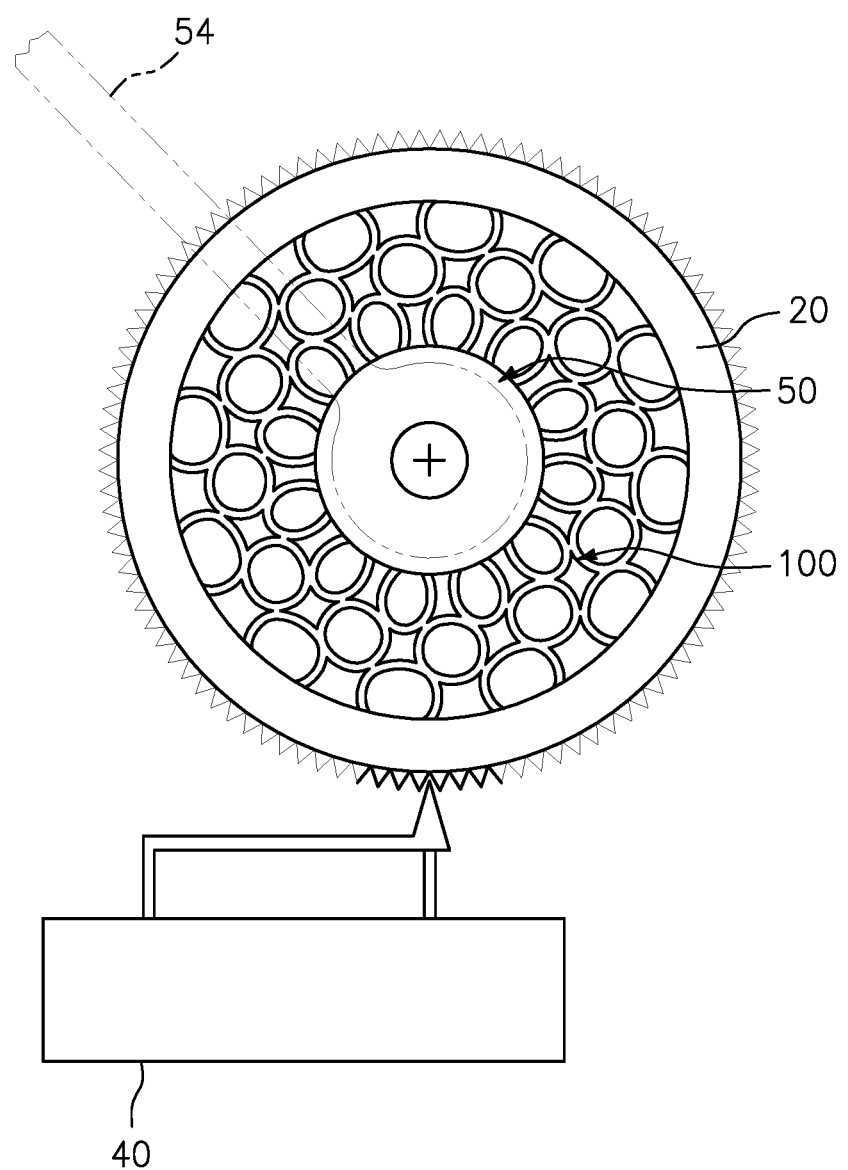
Figure 14:
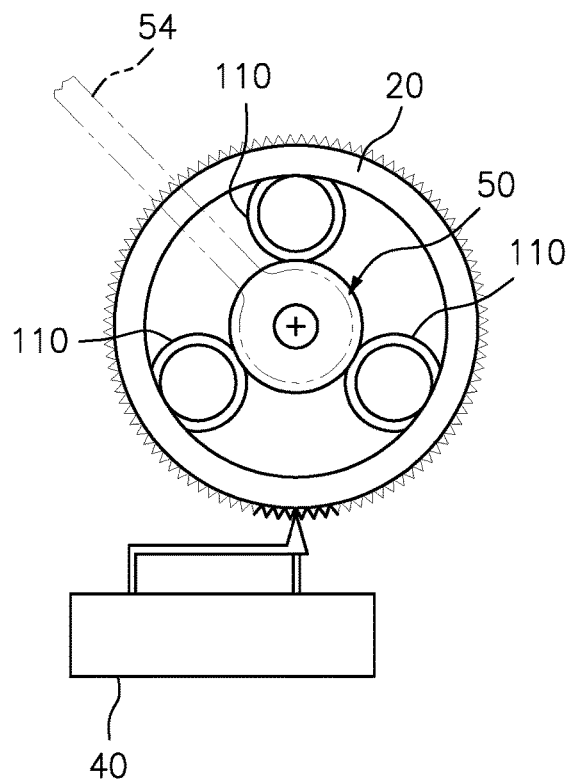
Figure 15:
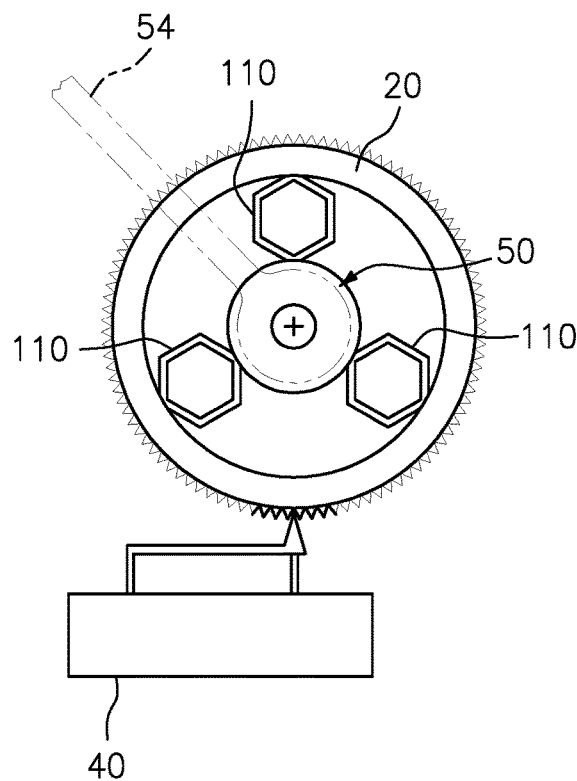
Figure 16:
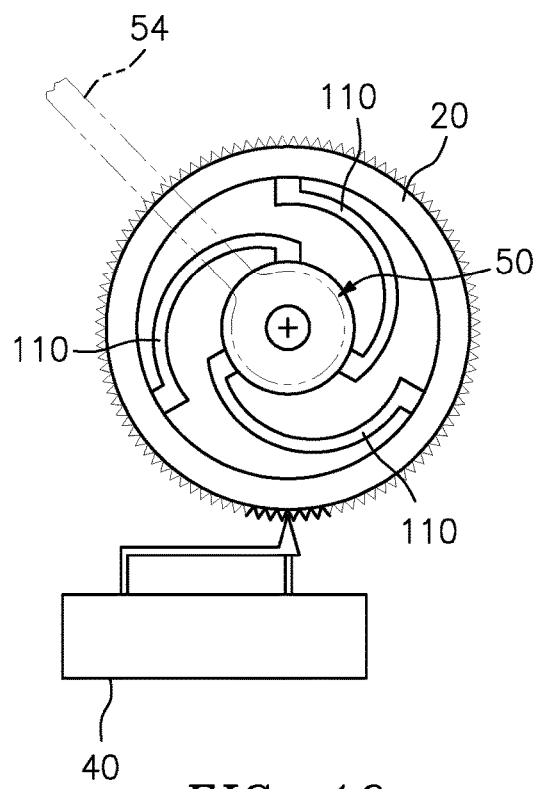
Figure 17:
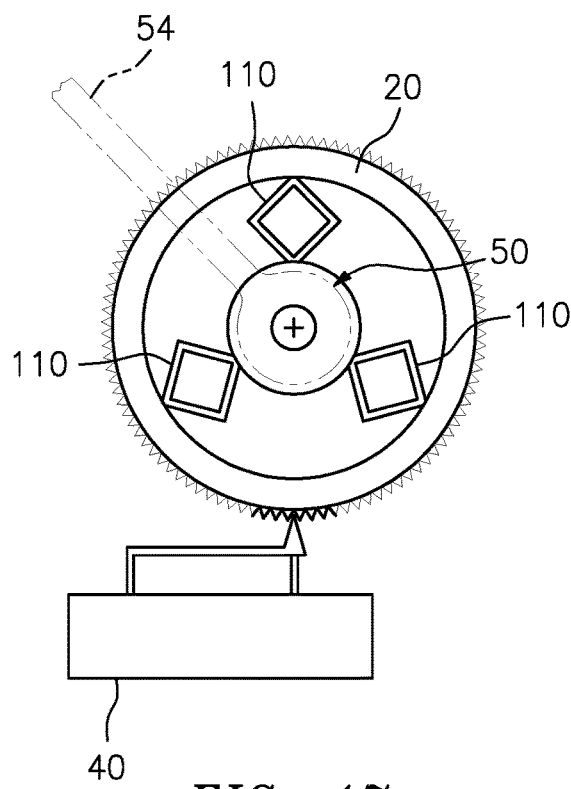
Figure 18:
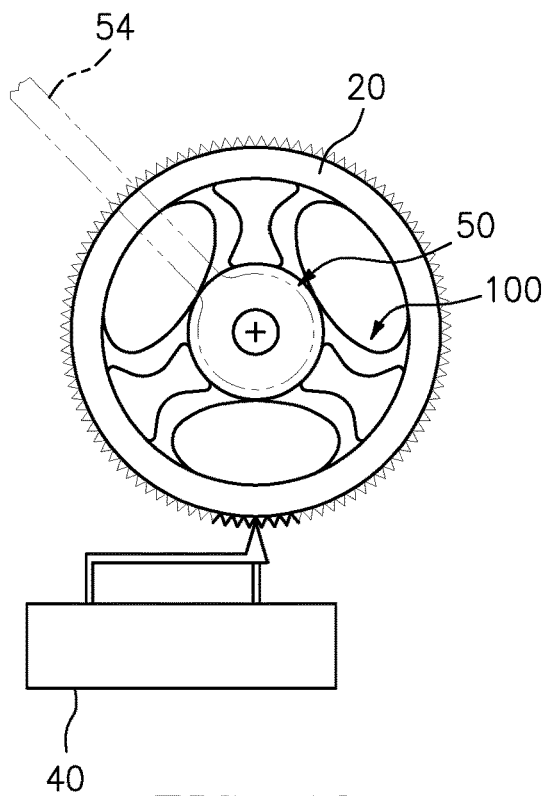
Figure 19:
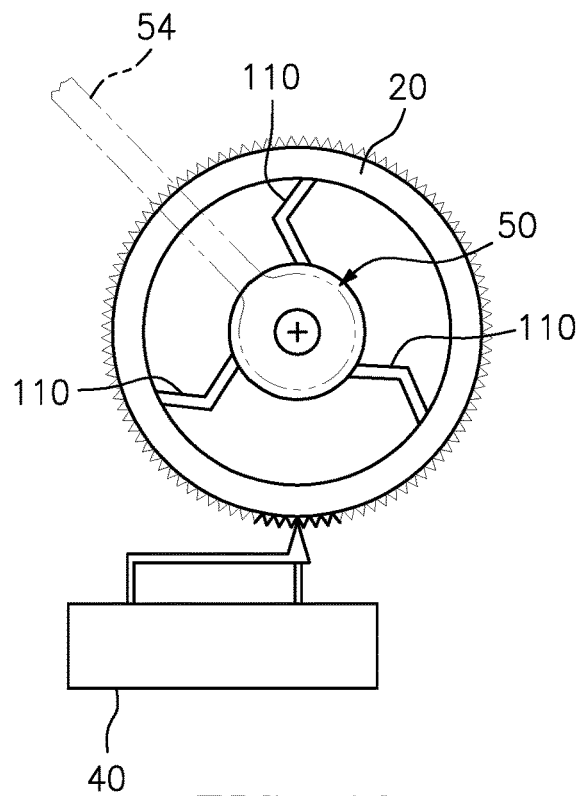
Figure 20:
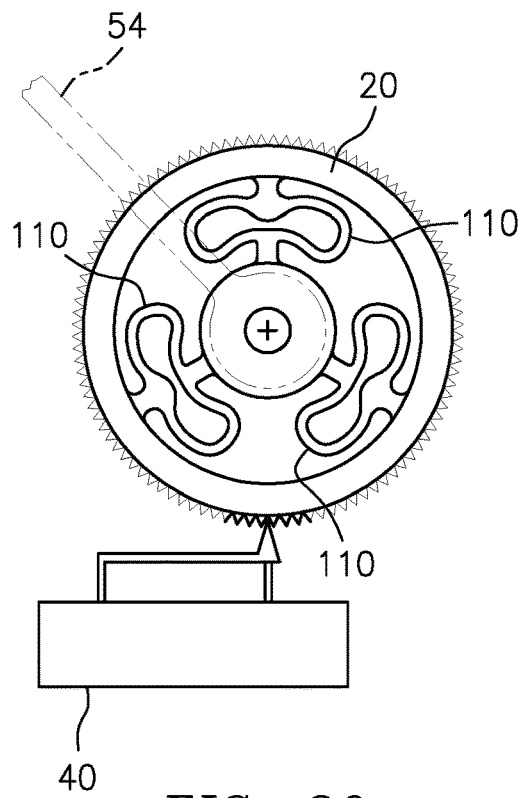
Figure 21:
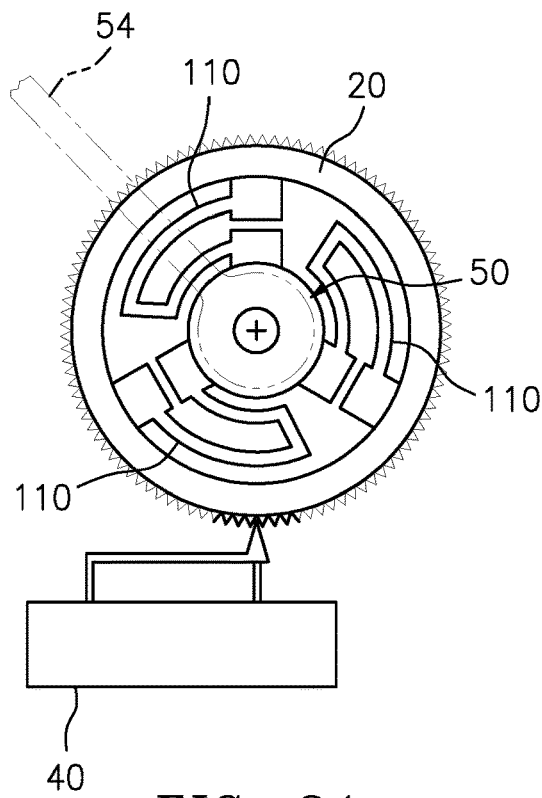
Figure 22:
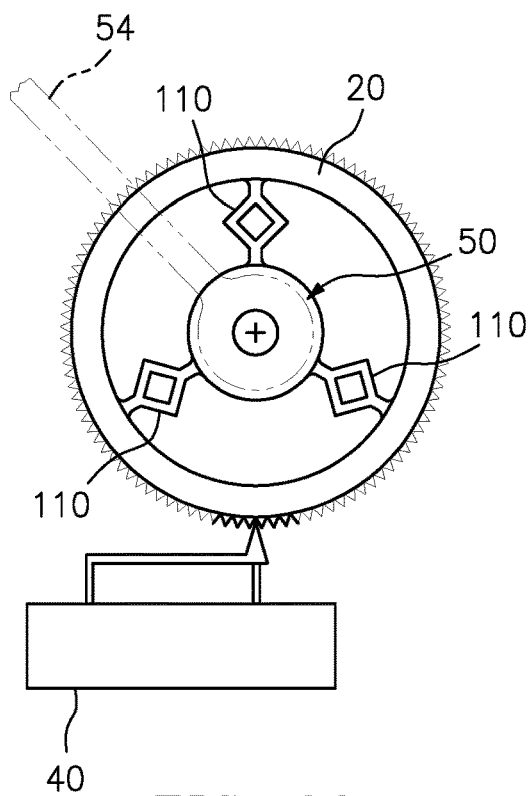
Figure 23:
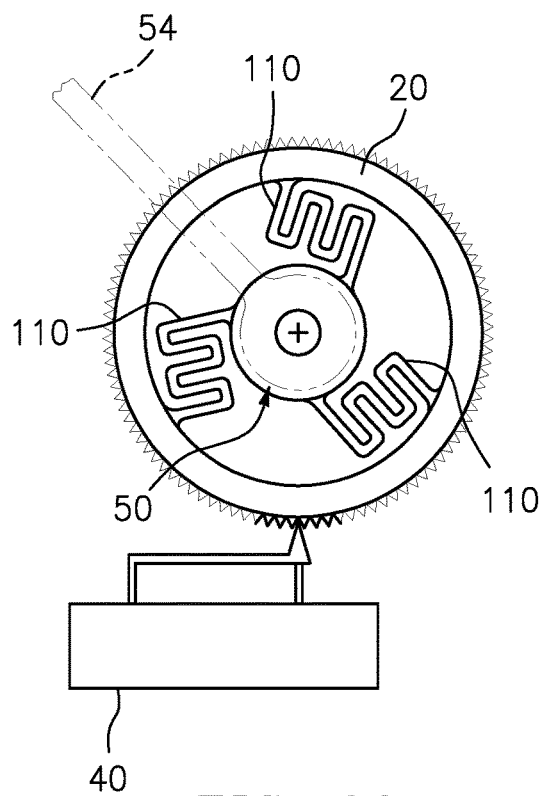
Figure 24:
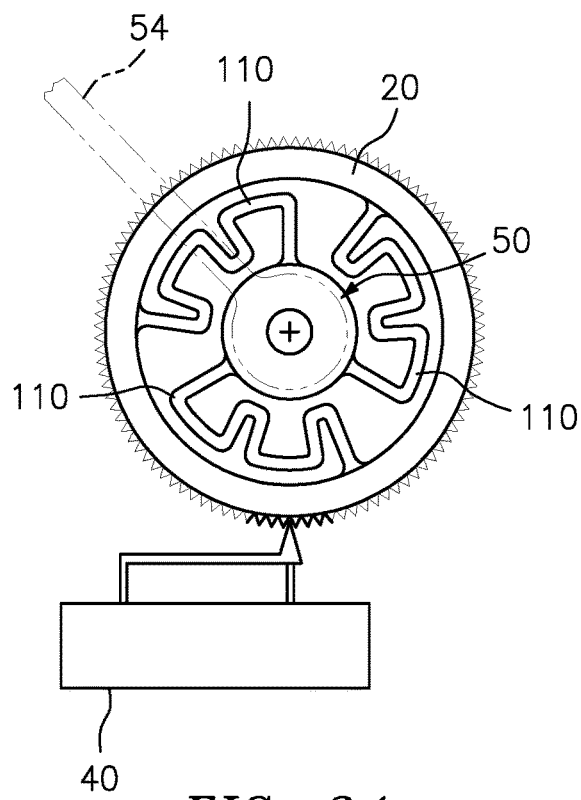
Figure 25:
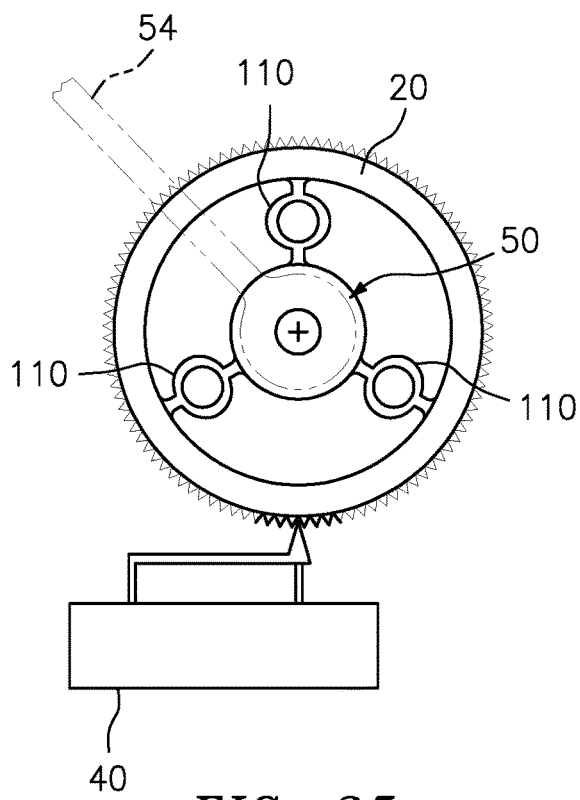
Figure 26:
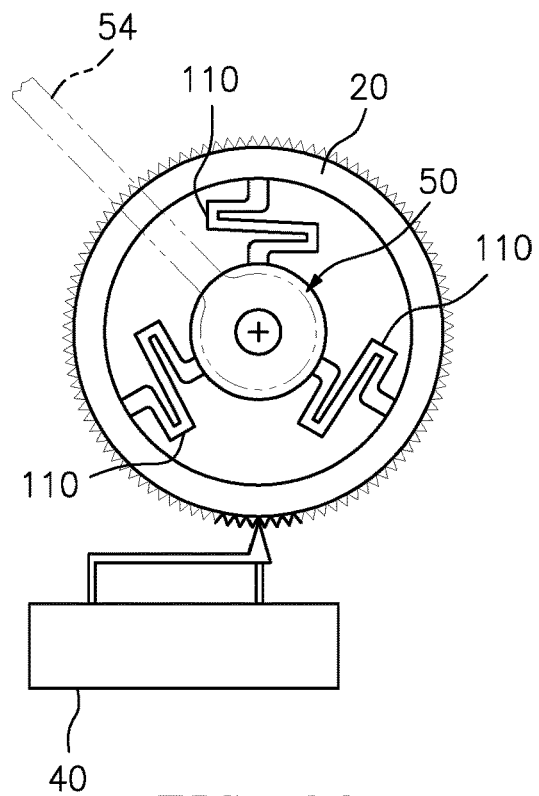
Figure 27:
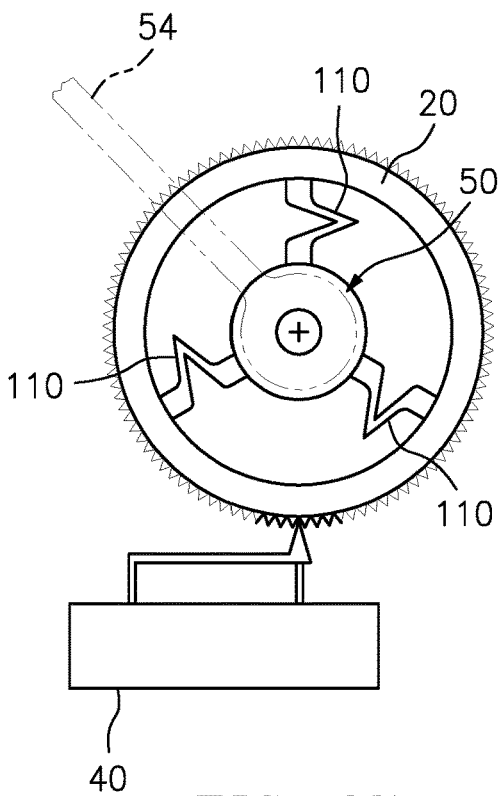
Figure 28:
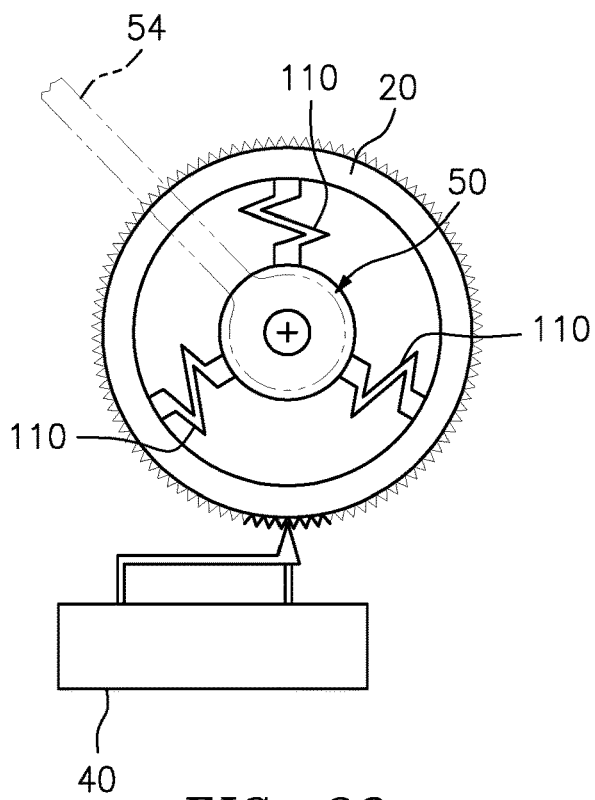
Figure 29:
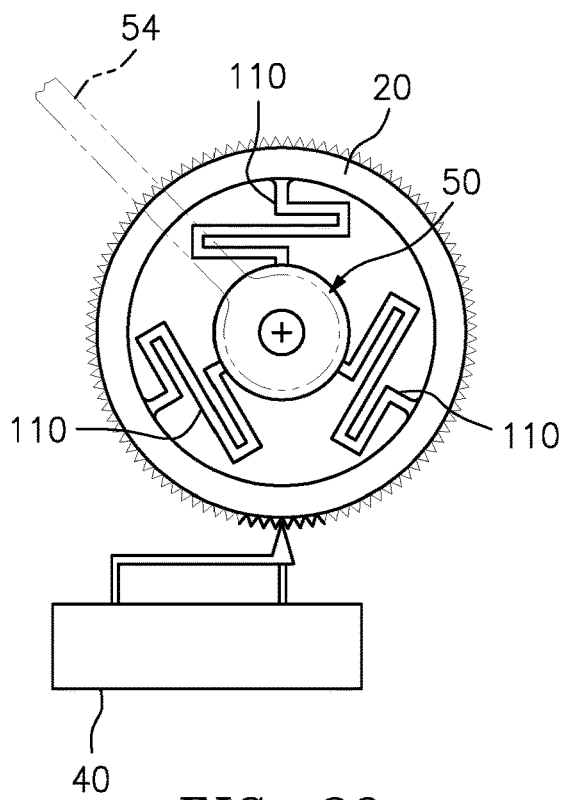
Figure 30:
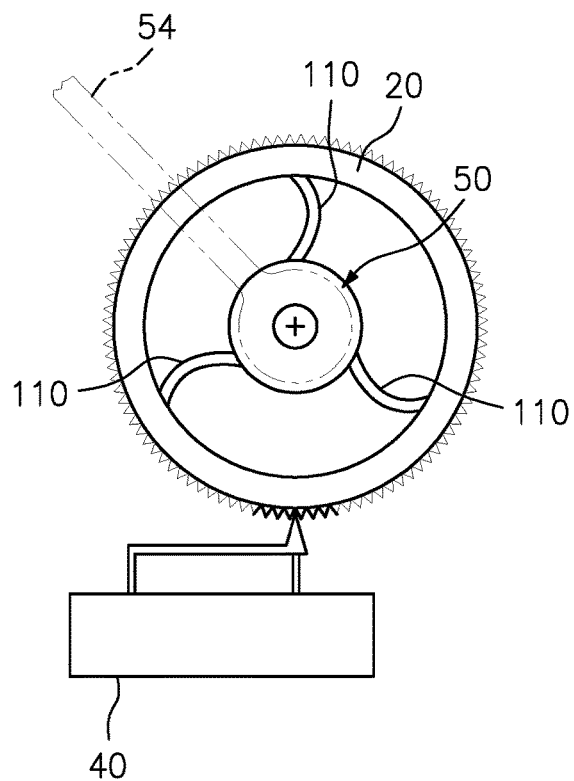
Figure 31:
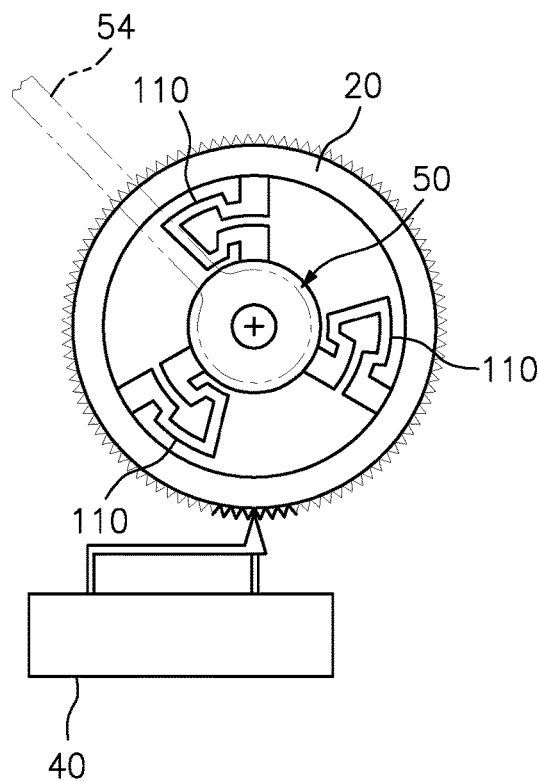
Figure 32:
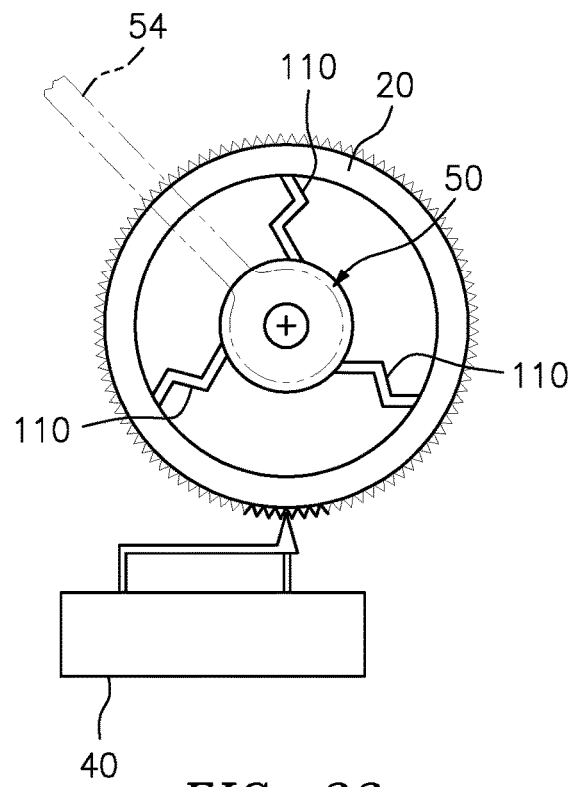
Figure 33:
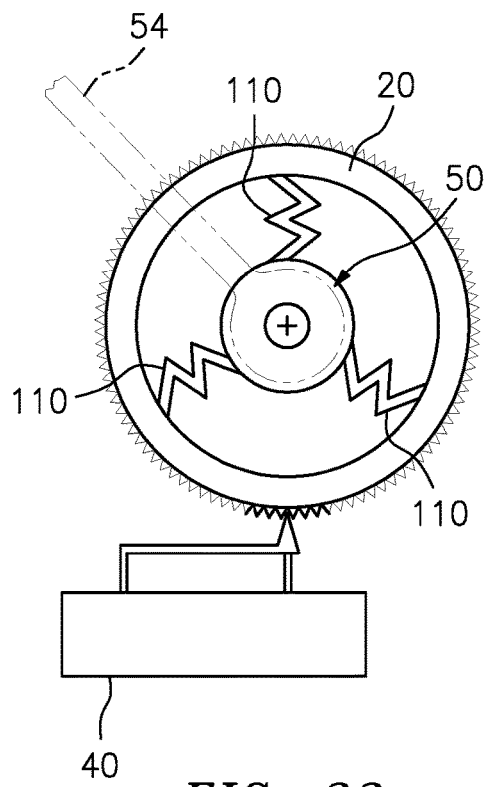
Figure 34:
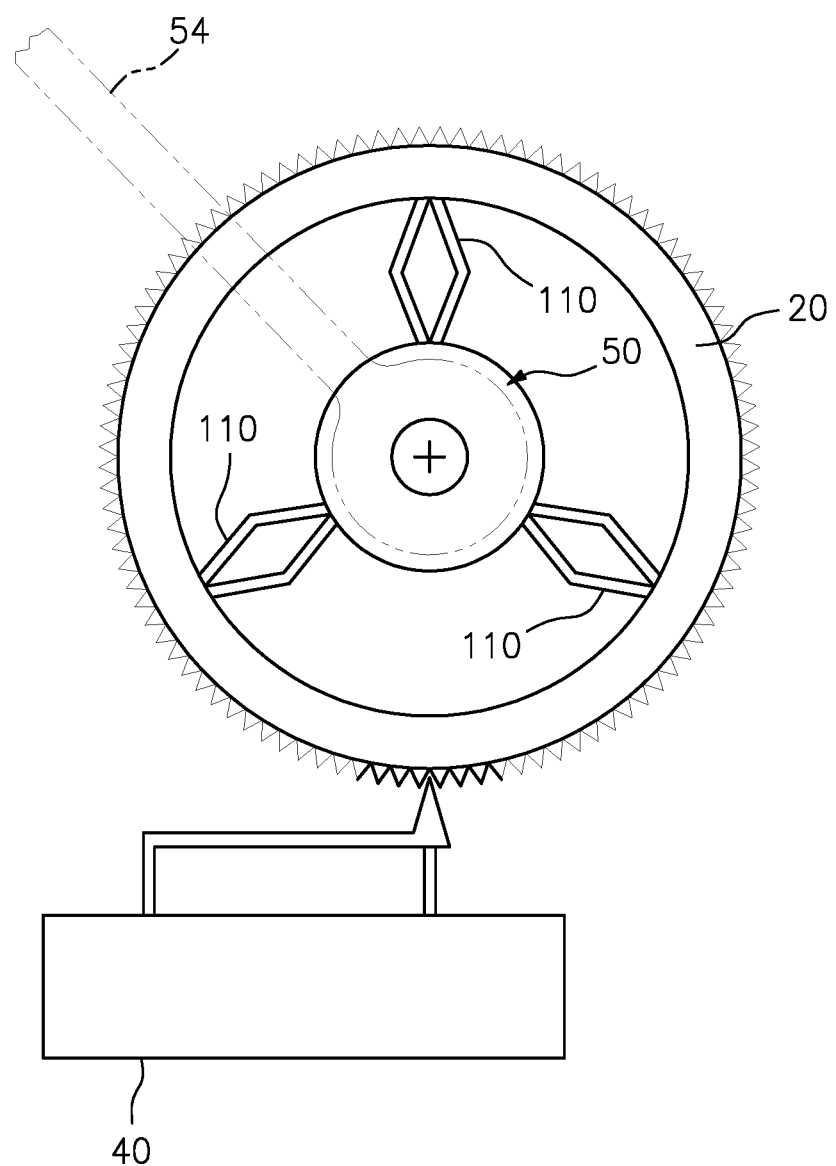
Figure 35:
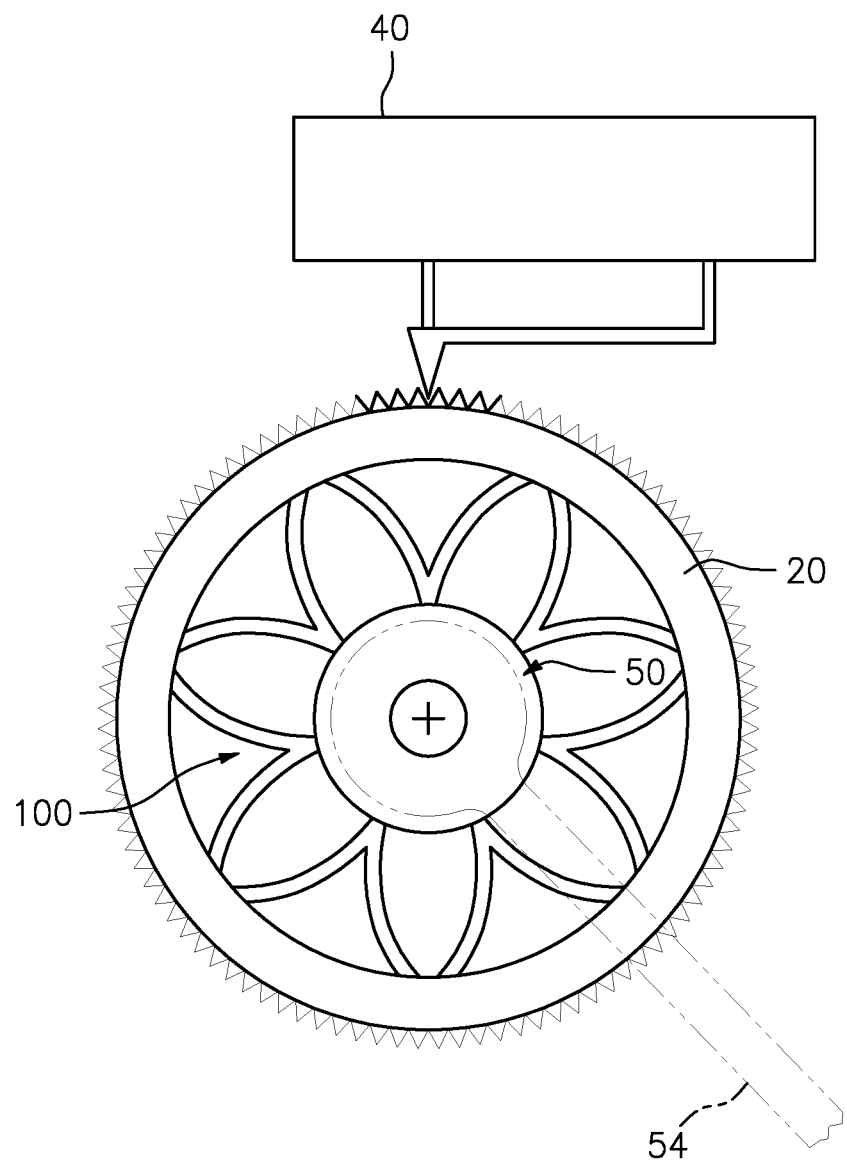
Figure 36:
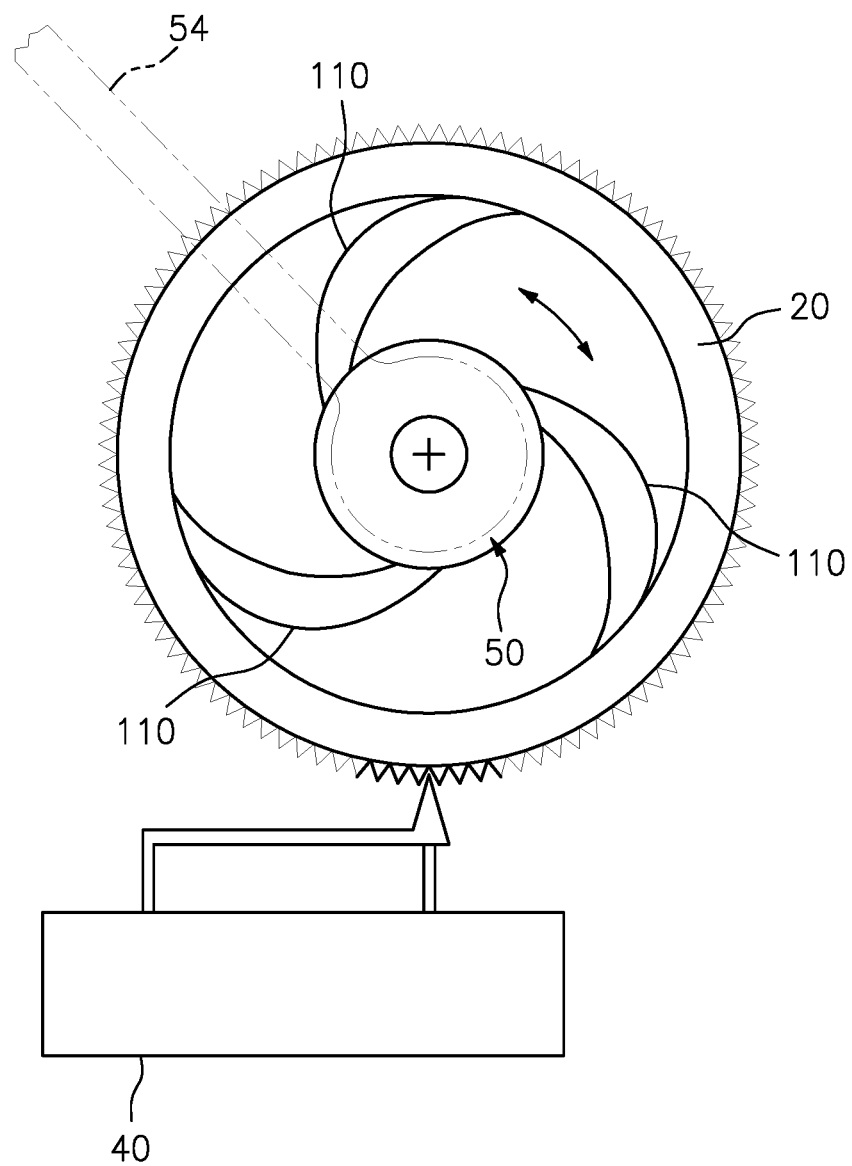

For example and preferably in each of the disclosed embodiments, the force absorbing assembly comprises one or more springs 110 coupling the indicator assembly 50 to the driven wheel 20. FIG. 7 as but just an example, illustrates a plurality of optional yet contemplated attachment members 150 between which the respective springs 110 may be coupled. The attachment members 150 may come in various sizes and shapes.

Figure 2:
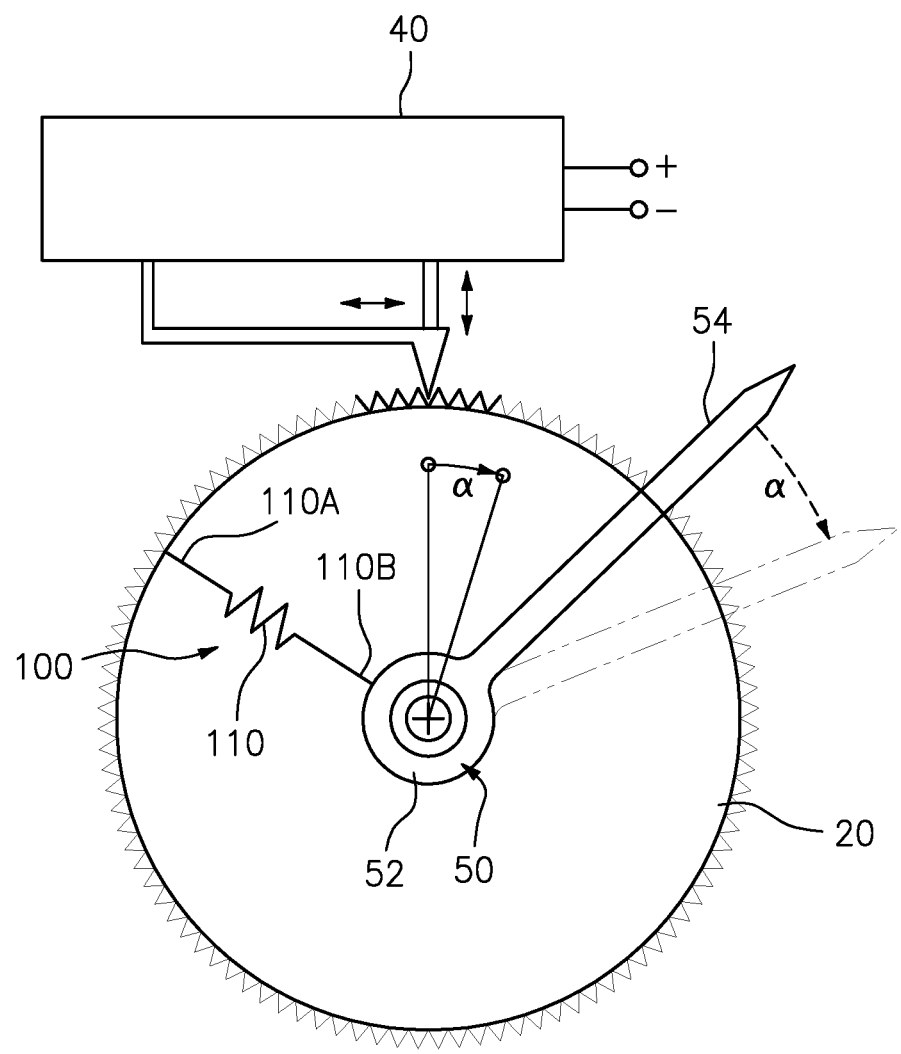
FIGS. 2-36 each illustrate various and/or alternative embodiments of a force absorbing assembly coupled intermediate the indicator assembly and the driven wheel, each and all being constructed in accordance with preferred embodiments of the present invention.
Figure 3:
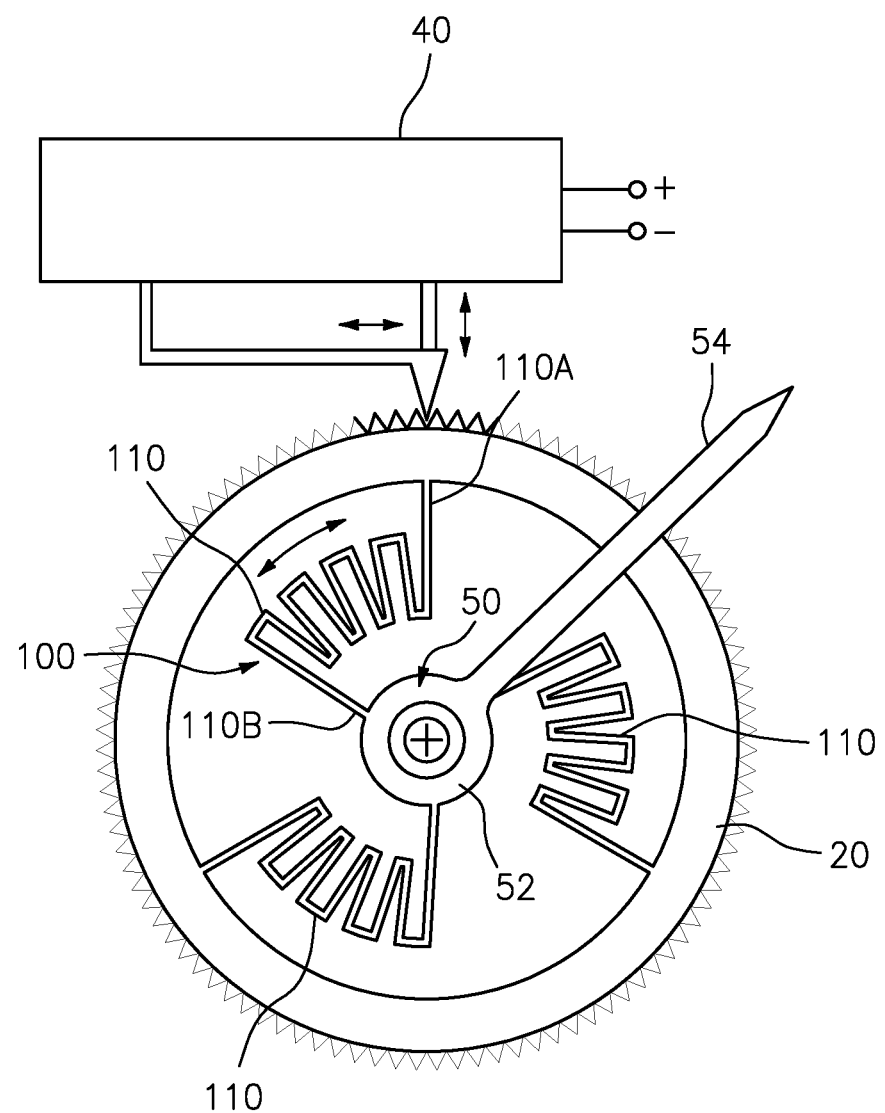
Figure 4:
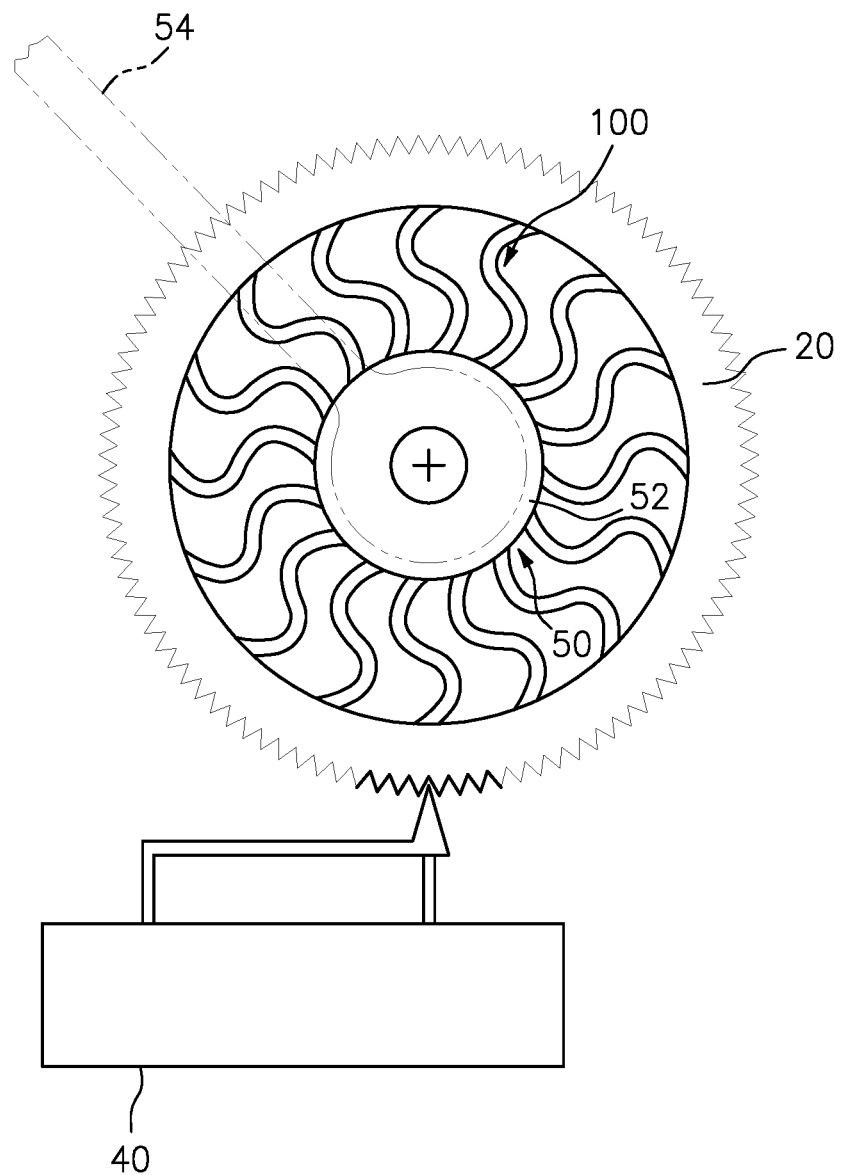
Figure 5:
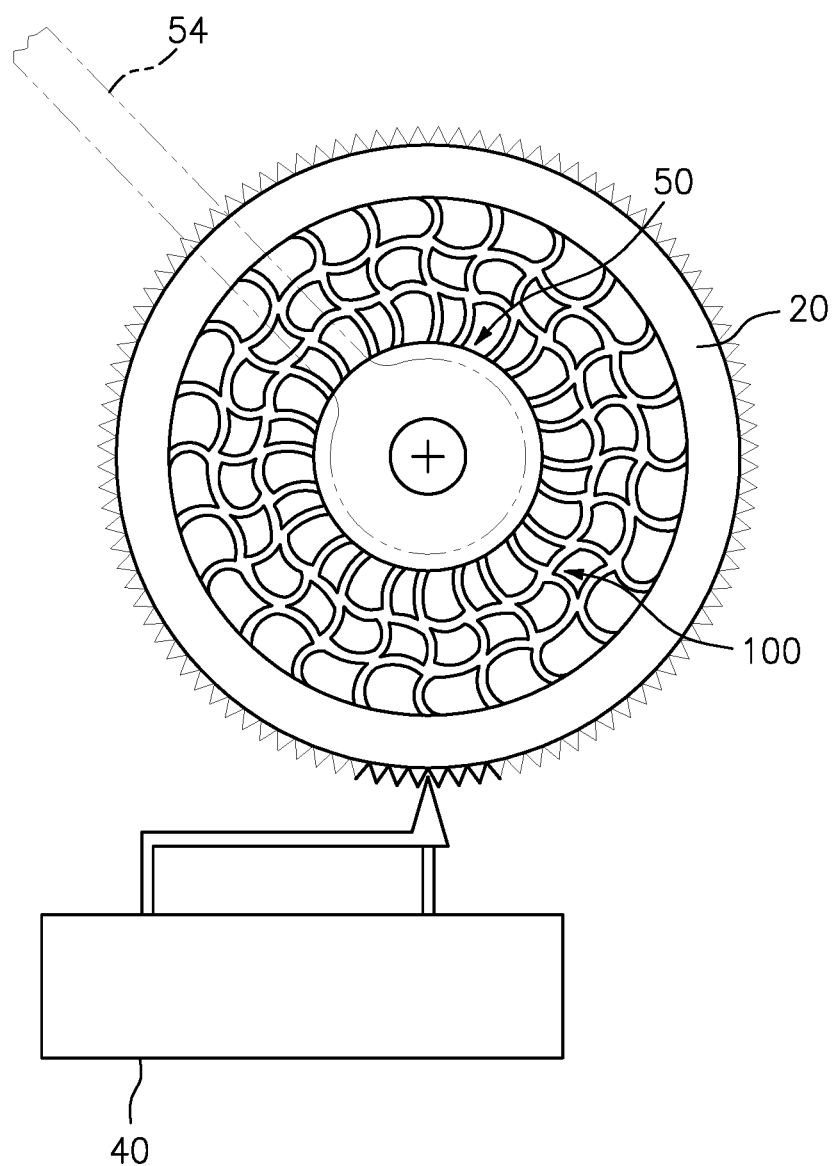
Figure 6:
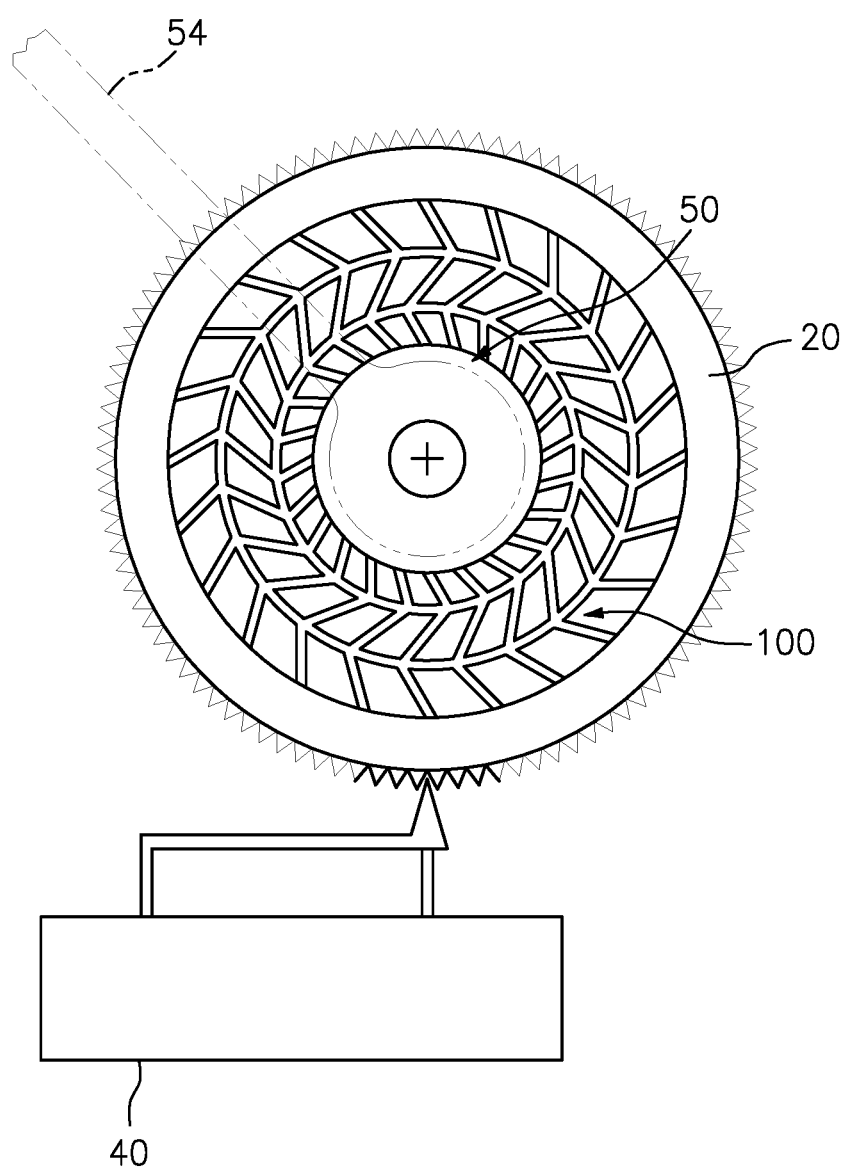

Preferably, and as illustrated in each of the FIGS. 2-36 but shown in greater particularly for example in FIGS. 2 and 3, each of the one or more springs has a respective first end 110A and second end 110B, and wherein the first end 110A of the each of the one or more springs is coupled to the driven wheel 20 and the second end 110B of the each of the one or more springs 110 is coupled to the indicator assembly 50, and preferably to wheel 52. Again, preferred embodiments of the present invention contemplate the use of attachment members 150, although again, such members are optional as disclosed and would be understood herein.

Preferably, the one or more springs 110 in any one of the disclosed embodiments is the only structure that completes the direct coupling between the indicator assembly 50 and the driven wheel 20. That is, the indicator assembly 50 would not rotate but for the physical coupling to the driven wheel 20 by the one or more springs 110. That is, preferably, it is only the one or more springs 110 that "bridges" the direct coupling between the driven wheel 20 and the indicator assembly 50. It should be understood that the foregoing disclosure and interpretation is intended to contemplate the use of one or more attachment members 150 as disclosed herein.

Preferably, and as shown with particularity in FIG. 1B, the driven wheel 20 is in the form of a ring having an inner edge 20A and an outer edge 20B and wherein the driving actuation assembly 30 engages the outer edge 20B of the driven wheel 20. Complementary is that the indicator assembly 50 comprises an outer wheel edge 52A and the force absorbing assembly 100 is connected between the inner edge 20A of the driven wheel 20 and the outer wheel edge 52A of the wheel 52 and/or between respective attachment members 150 as the case may be.

Turning now to FIG. 2 by way of example and not limitation, it can thus be seen that a force acting upon the indicator assembly 50, and in particular, upon indicator hand 54 sufficient to rotate indicator hand 54 α degrees, will be absorbed by the force absorbing assembly 100 (and in particular the one or more springs 110), so as to inhibit a rotation of the driven wheel 20 relative to the driving actuation assembly 30 due to the force acting upon the hand 54. By disclosing that the driven wheel 20 is inhibited from rotating relative to the driving actuation assembly 30, the embodiments disclosed in each of the FIGS. 1A, 1B, 1C are contemplated whether or not an intermediate actuator ring 25 is incorporated therein.

Preferred dimensions of the driven wheel 20 and the indicator assembly 50, for example, would be known by those skilled in the art and are thus of routine design choice. Preferably, the outer circumference of the driven wheels 20 have teeth (although not all teeth are shown in each of the figures) with the shape of the teeth on the outer circumference of driven wheel 20 (and/or the inner circumference of the actuator ring in the case of FIG. 1A) may be triangular, but they could also be other shapes, such as trapezoidal to possibly reduce the likelihood of interference between the respective teeth as they mesh as disclosed herein and/or implied herein with reference to the constructions with which they are used. In the preferred embodiment of FIG. 1A for example, the number of teeth for the driven wheel 20 may be three hundred (300) and/or six hundred (600) and the preferred number of teeth for the actuator ring 25 is one more than the number of teeth for the driven wheel 20, thus, being 301 and/or 601 respectively.

The particulars of the driving actuators 100 are also more particularly described in the respective patents incorporated herein by reference in their entireties.

Figure 37:
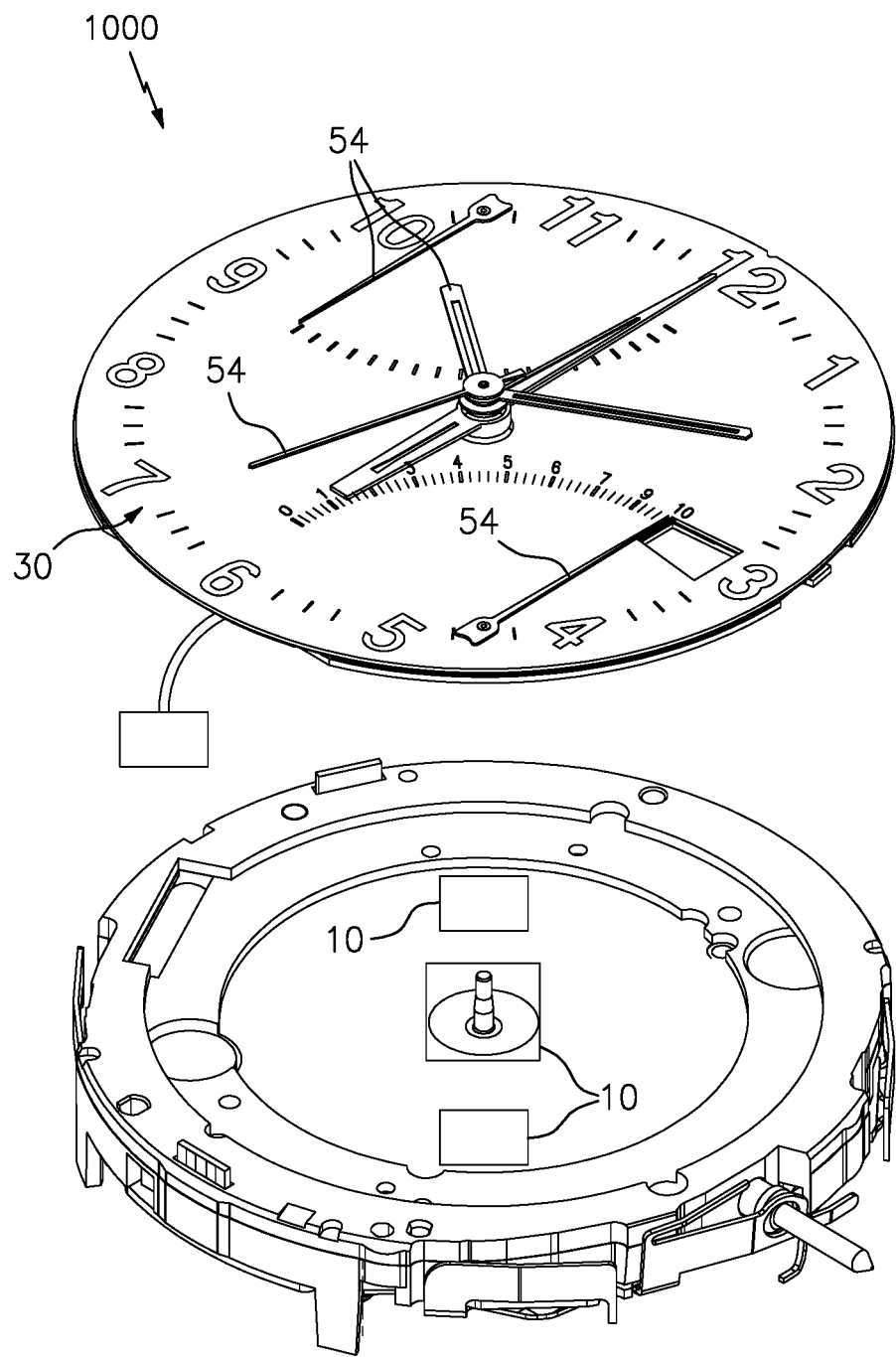
FIG. 37 illustrates a timepiece comprising any one or more of the bidirectional MEMS driving arrangements disclosed and illustrated herein.

Additionally, it should be understood that some of the figures, e.g. FIGS. 4-6 and 13 may not be illustrating the entire force absorbing assembly configuration, but this is only for purposes of brevity in illustration. Lastly, FIG. 37 illustrates a timepiece, generally indicated at 1000, comprising any one or more of the bidirectional MEMS driving arrangements 10 disclosed and illustrated herein.

As should also now be appreciated, the present invention is well suited for applications, such as for the motor(s) of a timepiece for example. For example, the present invention enables a driving gear train to be simplified by replacing the stepping motors with a driven wheel. Alternatively, and even in further simplification, the wheel trains can be replaced with driven wheel 20, which as disclosed herein, can be coupled to indicator assembly 50, which in turn is coupled to the display hand 54 to be driven. This coupling of the driven wheel to the display indicator could further simplify the construction and results in the elimination or reductions of the gears previously deemed necessary.

Moreover and importantly, the present invention provides an improved driving arrangement for an electronic device that utilizes the advantages afforded by the use of MEMS technology and includes an impact mitigation arrangement. For example, the present invention maintains the integrity of the electronic device and achieve other functional benefits of MEMS technology as would be achieved with traditional gears with metal or plastic wheels, yet using lighter, smaller and more miniaturized components that are found in and/or associated with MEMS structures. In particular, the present invention overcomes, is made resistant to and/or at least minimizes the effect of common forces and loads that can be applied to timepieces and that otherwise might cause a misalignment or other unwanted or undesirable displacement of the display indicator(s), all as disclosed and discussed above.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It should also be understood that the following claims are intended to cover all of the generic and specific features of the invention described herein and all statements of the scope of the invention that as a matter of language might fall therebetween.

What is claimed is:

1. A micro-electromechanical system (MEMS) driving arrangement for an electronic device comprising:
   a driven wheel in the form of a ring having an inner circumference and an outer circumference;
   a driving actuation assembly for causing rotation of the driven wheel;
   an indicator assembly comprising an indicator; and
   a force absorbing assembly coupled intermediate the indicator assembly and the driven wheel; and
   wherein the indicator assembly comprises an outer wheel circumference and the force absorbing assembly is directly connected between the inner circumference of the driven wheel and the outer wheel circumference of the indicator assembly;
   and wherein the indicator assembly lies in a same plane as and within the inner circumference of the driven wheel;
   whereby a force acting upon the indicator assembly is absorbed by the force absorbing assembly so as to inhibit rotation of the driven wheel relative to the driving actuation assembly.

2. The micro-electromechanical systems (MEMS) driving arrangement for an electronic device as claimed in claim 1, wherein the force absorbing assembly physically connects the indicator assembly to the driven wheel.

3. The micro-electromechanical systems (MEMS) driving arrangement for an electronic device as claimed in claim 1, wherein the force absorbing assembly comprises one or more springs coupling the indicator assembly to the driven wheel.

4. The micro-electromechanical systems (MEMS) driving arrangement for an electronic device as claimed in claim 3, wherein each of the one or more springs has a respective first end and second end, and
wherein the first end of the each of the one or more springs is coupled to the driven wheel and the second end of the each of the one or more springs is coupled to the indicator assembly.

5. The micro-electromechanical systems (MEMS) driving arrangement for an electronic device as claimed in claim 1, wherein:
the driving actuation assembly engages the outer circumference of the driven wheel.

6. The micro-electromechanical systems (MEMS) driving arrangement for an electronic device as claimed in claim 1, wherein the indicator assembly comprises an indicator wheel and wherein the force absorbing assembly couples the inner circumference of the driven wheel to an outer circumference of the indicator wheel.

7. The micro-electromechanical systems (MEMS) driving arrangement for an electronic device as claimed in claim 6, wherein the force absorbing assembly is coupled between the inner circumference of the driven wheel and the outer circumference of the indicator wheel.

8. The micro-electromechanical systems (MEMS) driving arrangement for an electronic device as claimed in claim 1, wherein the indicator assembly comprises an indicator wheel and the force absorbing assembly is coupled intermediate the driven wheel and the indicator wheel.

9. The micro-electromechanical systems (MEMS) driving arrangement for an electronic device as claimed in claim 8, wherein the force absorbing assembly comprises one or more springs coupling the indicator wheel to the driven wheel.

10. The micro-electromechanical systems (MEMS) driving arrangement for an electronic device as claimed in claim 9, wherein a first end of the one or more springs is coupled to the indicator wheel and a second end of the one or more springs is coupled to the driven wheel.

11. The micro-electromechanical systems (MEMS) driving arrangement for an electronic device as claimed in claim 1, wherein the force absorbing assembly is the only structure that completes the direct coupling between the indicator assembly and the driven wheel.

12. The micro-electromechanical systems (MEMS) driving arrangement for an electronic device as claimed in claim 11, wherein the force absorbing assembly comprises one or more springs, and but for the one or more springs, the indicator assembly would not rotate when the driven wheel rotates.

13. The micro-electromechanical systems (MEMS) driving arrangement as claimed in claim 12, comprising:
a first attachment member intermediate the driven wheel and a first end of the force absorbing assembly; and
a second attachment member intermediate the indicator assembly and the second end of the force absorbing assembly.

14. The micro-electromechanical systems (MEMS) driving arrangement for an electronic device as claimed in claim 13, wherein the force absorbing assembly comprises a first spring and at least a second spring, and wherein the micro-electromechanical systems (MEMS) driving arrangement comprises:
a first attachment member intermediate the driven wheel and a first end of the first spring, and a second attachment member intermediate the indicator assembly and the second end of the first spring; and
a third attachment member intermediate the driven wheel and a first end of the at least second spring, and a fourth attachment member intermediate the indicator assembly and the second end of the at least second spring.

15. A micro-electromechanical system (MEMS) driving arrangement for an electronic device comprising:
a driven wheel in the form of a ring having an inner circumference and an outer circumference;
a driving actuation assembly for causing rotation of the driven wheel;
an indicator assembly comprising an indicator wheel with an indicator coupled to the indicator wheel;
wherein the indicator wheel and the driven wheel lie in the same plane and rotate about the same axis; and
a force absorbing assembly coupled intermediate the indicator assembly and the driven wheel; and
wherein the indicator assembly comprises an outer wheel circumference and the force absorbing assembly is directly connected between the inner circumference of the driven wheel and the outer wheel circumference of the indicator assembly;
whereby a force acting upon the indicator assembly is absorbed by the force absorbing assembly so as to inhibit rotation of the driven wheel relative to the driving actuation assembly.

* * * * *